United States Patent
Iguchi et al.

(10) Patent No.: US 7,035,752 B2
(45) Date of Patent: Apr. 25, 2006

(54) SEMICONDUCTOR TEST DATA ANALYSIS SYSTEM

(75) Inventors: Yasuhiko Iguchi, Tokyo (JP); Hiroshi Tamura, Tokyo (JP); Mitsuhiro Enokida, Tokyo (JP); Earl Louis Dombroski, Rio Rancho, NM (US); Thomas Robert Claus, Albuquerque, NM (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/028,823

(22) Filed: Jan. 4, 2005

(65) Prior Publication Data

US 2005/0119852 A1    Jun. 2, 2005

Related U.S. Application Data

(63) Continuation of application No. 10/186,171, filed on Jun. 28, 2002, now Pat. No. 6,898,545.

(51) Int. Cl.
*H01L 21/66* (2006.01)

(52) U.S. Cl. ..................... 702/118; 700/121; 438/17; 714/738; 714/720; 324/555; 324/765; 324/158.1

(58) Field of Classification Search ............. 702/16, 702/31, 32, 118–120, 122, 123, 182–187, 702/189, FOR. 134, FOR. 135, FOR. 137, 702/FOR. 155, FOR. 170, FOR. 171; 700/121; 438/14, 15, 17, 592, 622; 714/738, 720; 324/555, 765, 158.1

See application file for complete search history.

(56) References Cited

U.S. PATENT DOCUMENTS

| | | | | |
|---|---|---|---|---|
| 5,371,851 A | * | 12/1994 | Pieper et al. | ............... 345/501 |
| 5,568,408 A | | 10/1996 | Maeda | ....................... 702/117 |
| 5,761,417 A | | 6/1998 | Henley et al. | .............. 709/231 |
| 6,097,204 A | | 8/2000 | Tanaka et al. | ............. 324/765 |
| 6,128,759 A | * | 10/2000 | Hansen | ....................... 714/738 |
| 6,292,766 B1 | | 9/2001 | Mattos et al. | ................. 703/14 |
| 6,319,737 B1 | * | 11/2001 | Putnam et al. | ................ 438/17 |

(Continued)

FOREIGN PATENT DOCUMENTS

WO    WO 93/24896    12/1993

OTHER PUBLICATIONS

Eric Boskin, IDS Software Systems, "Enabling Data-Driven Yield Management Decisions" Jun. 28, 2002, 40 pps. www.idsusa.com.

*Primary Examiner*—Carol S. W. Tsai

(57) ABSTRACT

A semiconductor test data analysis system (1) automatically recording, during an analysis operation, operation information of the analysis operation, including analysis conditions or an analysis procedure for input test data, or analysis information obtained by the analysis operation. The analysis system includes a processing means (101), an analysis target data storage means (109), which stores the test data as analysis target data, a historical data storage means (107), which stores as historical data either operation information of the analysis operation or analysis information obtained by the analysis operation, and a display data storage means (112), which stores analysis information obtained by the analysis operation, which stores analysis display data generated by the processing means for the purpose of displaying the analysis information obtained by the analysis operation. In this system, when a new analysis operation is specified, the processing means (101) processes the input test data in accordance with the analysis operation, and processes at least one of the analysis target data, historical data, and display data by the new analysis operation.

3 Claims, 30 Drawing Sheets

U.S. PATENT DOCUMENTS

| | | | |
|---|---|---|---|
| 6,553,546 B1 | 4/2003 | Murakami | 716/4 |
| 6,567,168 B1 | 5/2003 | Nara et al. | 356/394 |
| 6,603,691 B1 | 8/2003 | Yoo et al. | 365/201 |
| 6,629,090 B1 | 9/2003 | Tsuda et al. | 706/47 |
| 6,681,351 B1 * | 1/2004 | Kittross et al. | 714/724 |
| 6,707,474 B1 * | 3/2004 | Beck et al. | 715/771 |
| 2001/0001015 A1 * | 5/2001 | Ishikawa et al. | 382/149 |
| 2001/0005132 A1 | 6/2001 | Nishikawa et al. | 324/158.1 |
| 2001/0038708 A1 * | 11/2001 | Ishikawa et al. | 382/141 |
| 2002/0061606 A1 | 5/2002 | Honma et al. | 438/14 |
| 2002/0073374 A1 * | 6/2002 | Danialy et al. | 714/738 |
| 2002/0109734 A1 * | 8/2002 | Umezu et al. | 345/846 |
| 2002/0165692 A1 | 11/2002 | Sato et al. | 702/181 |
| 2002/0170022 A1 | 11/2002 | Shirai et al. | 716/4 |
| 2003/0013249 A1 | 1/2003 | Honma et al. | 438/200 |
| 2003/0074098 A1 | 4/2003 | Cheung et al. | 700/121 |
| 2003/0132965 A1 * | 7/2003 | Santori et al. | 345/763 |

* cited by examiner

FIG. 31

ANALYSIS TARGET DATA ACQUISITION

Figure 23:
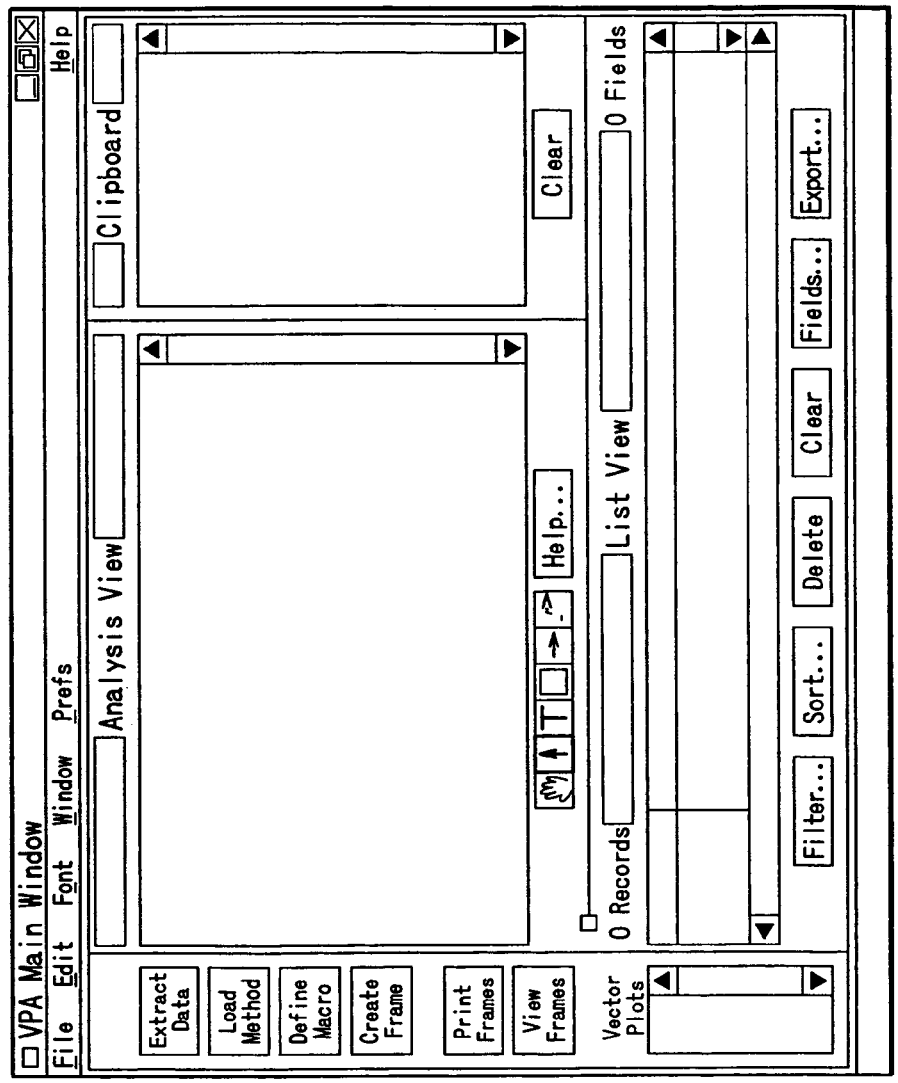

| FROM THE MAIN WINDOW, EXTRACT DATA BUTTON SHOWN IN FIG. 23 IS SELECTED, AND EITHER A DATABASE IS SEARCHED OR A DATA FILE IS READ IN. |

| AN ICON IS DISPLAYED, AS INDICATED BY 201 IN FIG. 2. |

| IF NECESSARY, A PLURALITY OF DATA SETS LOADED FROM THE SYSTEM ARE INTEGRATED. |

FIG. 32

FILTERING

| FROM THE HISTORY WINDOW SHOWN IN FIG. 2, ONE ICON IS ACTIVATED. |

| THE FILTER BUTTON IN THE MAIN WINDOW SHOWN IN FIG. 24 IS SELECTED. |

Figure 5:
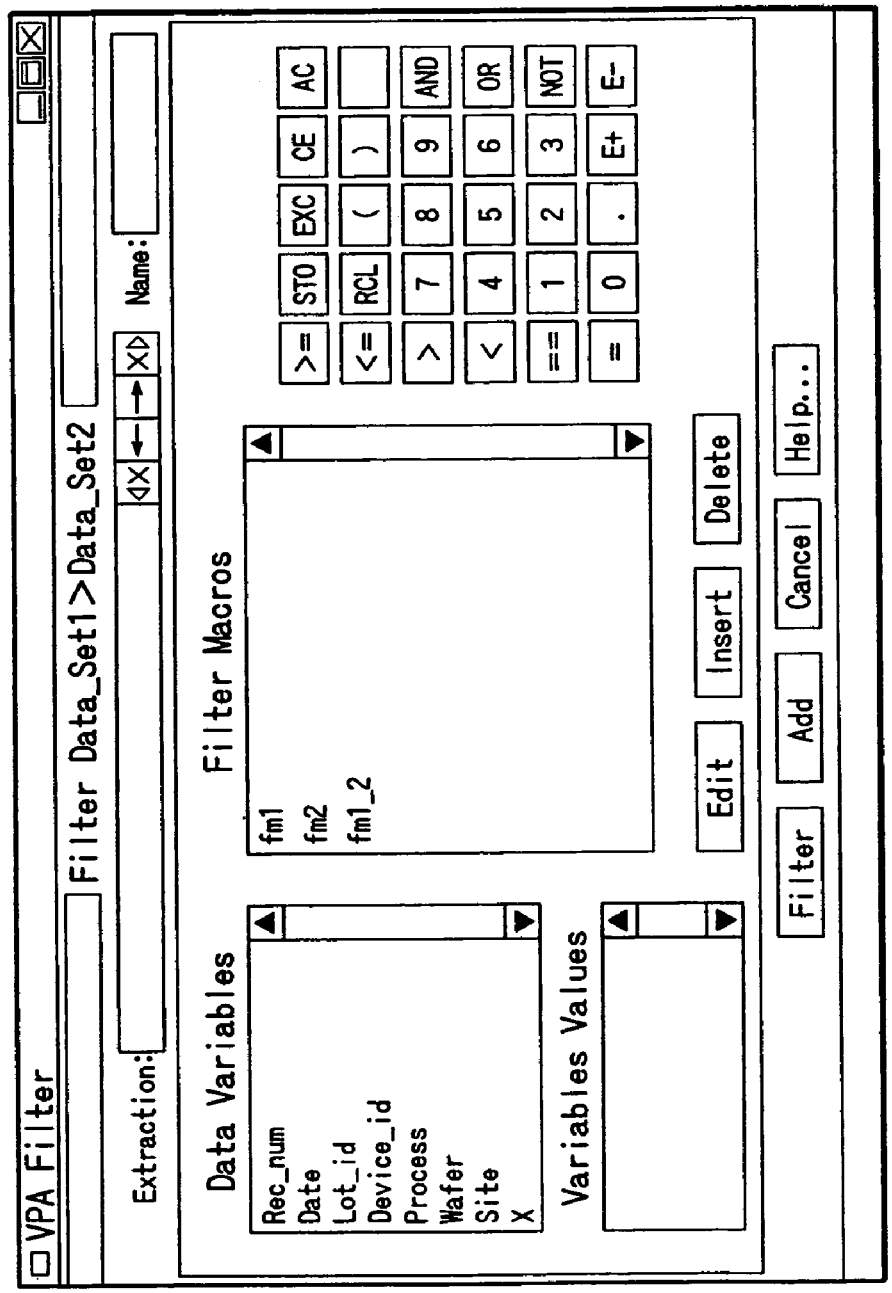

| FROM THE FILTER WINDOW SHOWN IN FIG. 5, INSTRUCTION FOR THE OPERATION (FILTER) IS GIVEN, AND THE FILTER BUTTON IS SELECTED. |

Figure 2:
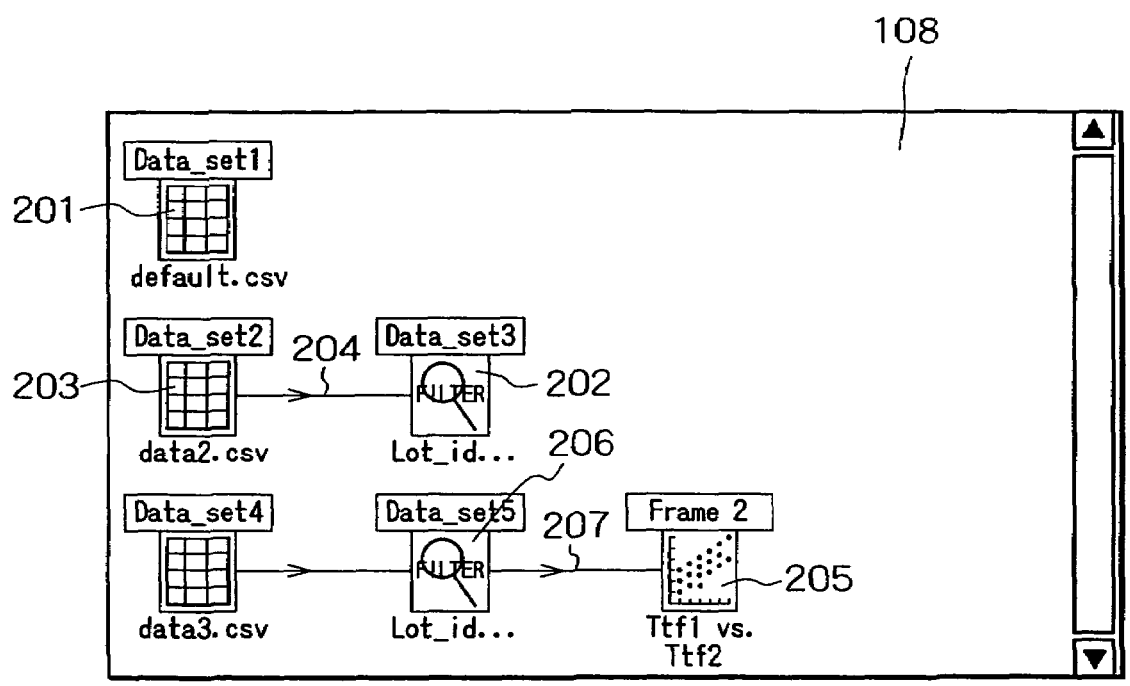

| AS SHOWN BY THE REFERENCE NUMERALS 202, 203, AND 204 IN FIG. 2, THE ORIGINAL ICON AND ICONS ASSOCIATED WITH FILTERING ARE DISPLAYED, WITH INDICATORS BETWEEN THESE ICONS. |

FIG. 33

SORTING

Figure 6:
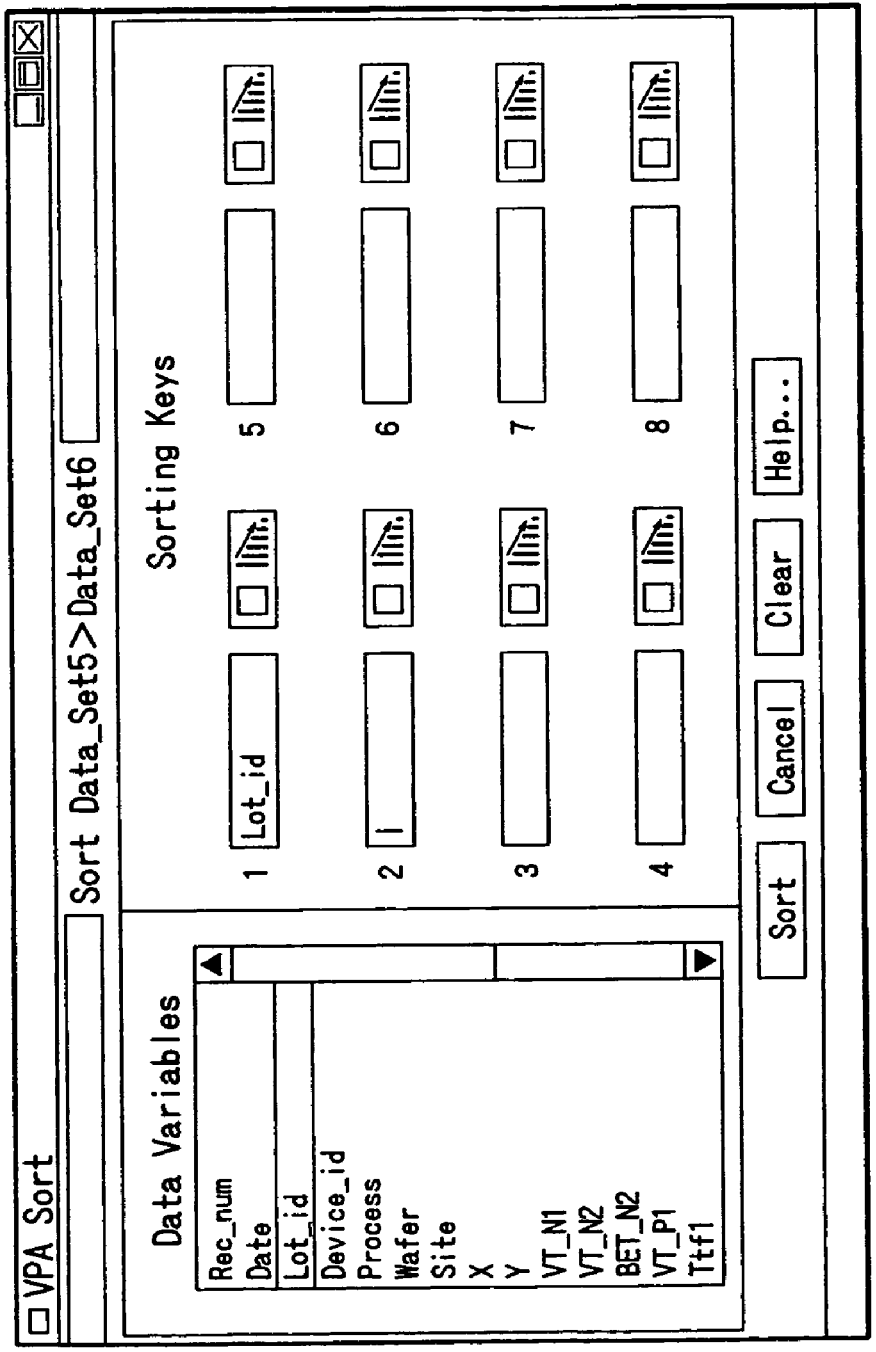
Figure 24:
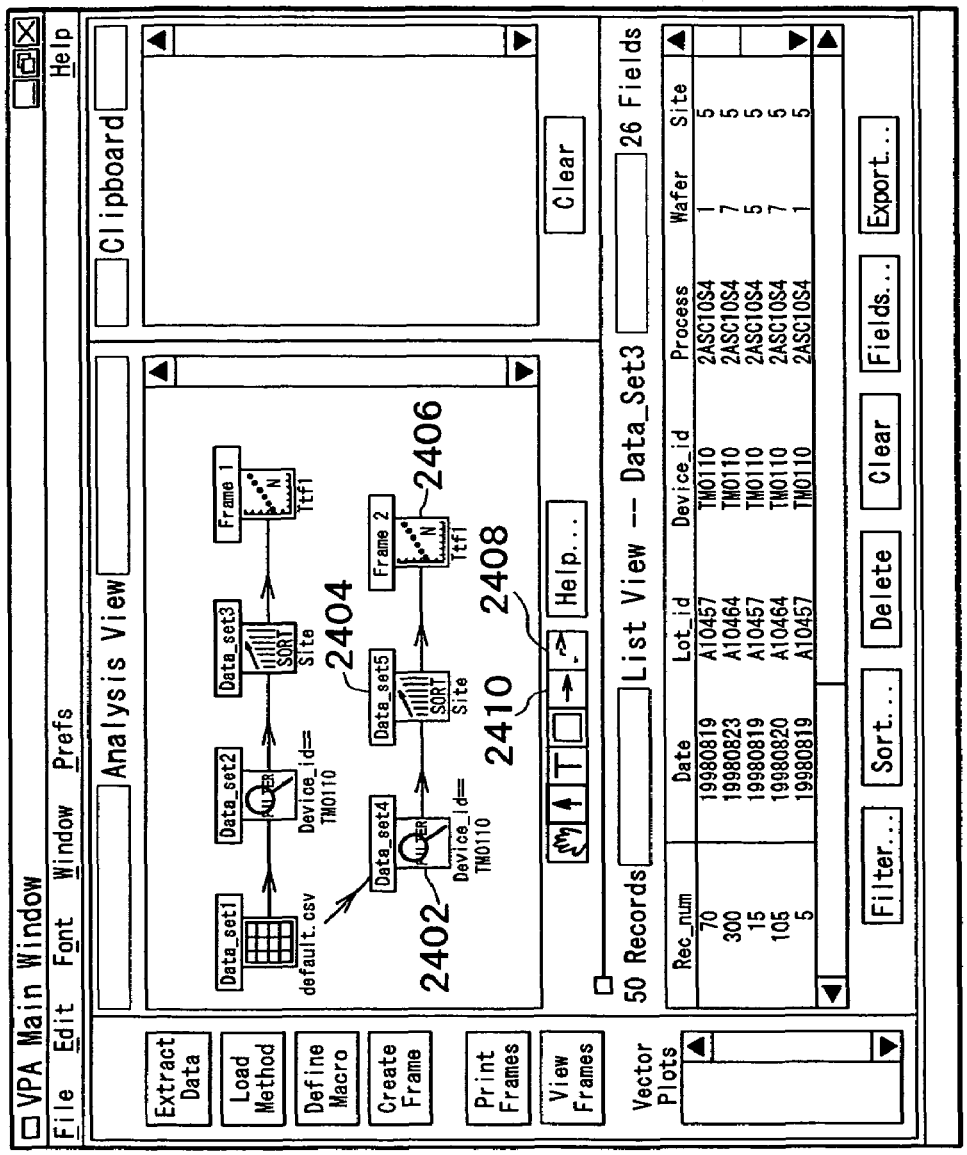

```
FROM THE HISTORY WINDOW SHOWN
IN FIG. 2 AN ICON IS ACTIVATED.
          ↓
THE SORT BUTTON IN THE MAIN WINDOW
SHOWN IN FIG. 24 IS SELECTED.
          ↓
FROM THE SORT WINDOW SHOWN IN
FIG. 6, THE INSTRUCTION IS GIVEN
FOR SORT PROCESSING, AND
THE SORT BUTTON IS SELECTED.
          ↓
AS SHOWN BY Data_set3 IN FIG. 24,
ARROWS AND ICONS ARE DISPLAYED,
AND DATA IS GENERATED.
```

FIG. 34

GRAPHING

```
FROM THE HISTORY WINDOW SHOWN
IN FIG. 2, AN ICON IS ACTIVATED.
          ↓
IN ORDER TO GENERATE A GRAPH IN THE
MAIN WINDOW, THE CREATE FRAME
BUTTON SHOWN IN FIG. 24 IS SELECTED.
          ↓
VARIOUS SETTINGS OF
THE WINDOWS IN FIG. 25 AND FIG. 13
THROUGH FIG. 18 ARE MADE AND
THE PLOT BUTTON IS SELECTED.
          ↓
AS SHOWN IN FIG. 7 TO FIG. 12,
THE ARROWS AND ICONS ARE DISPLAYED
(A DATA SET IS NOT CREATED).
```

FIG. 35

COPY & PASTE

Figure 19:
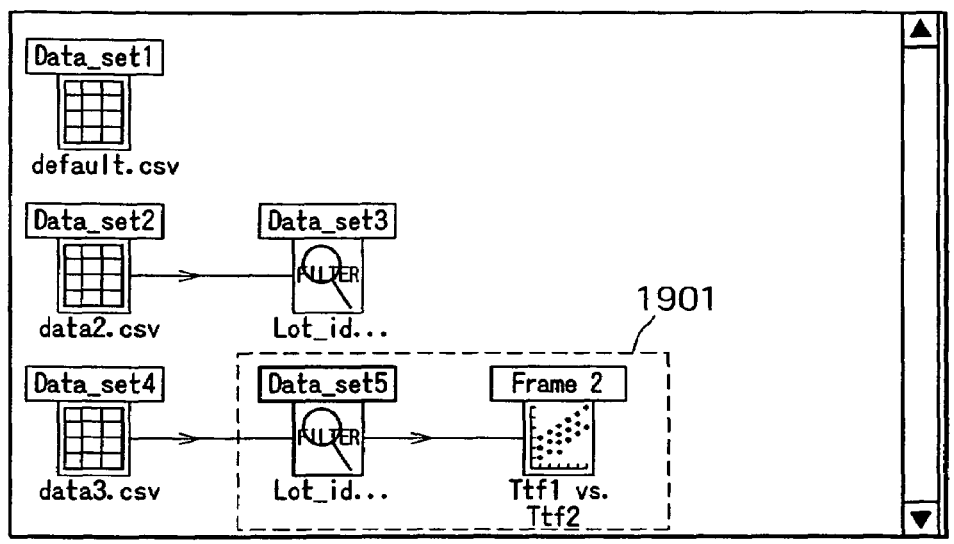
Figure 20:
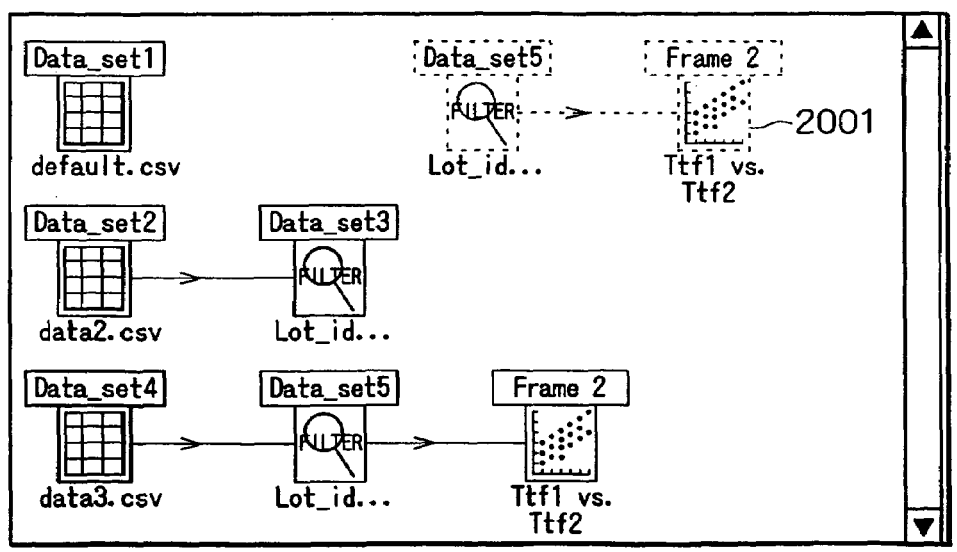
Figure 21:
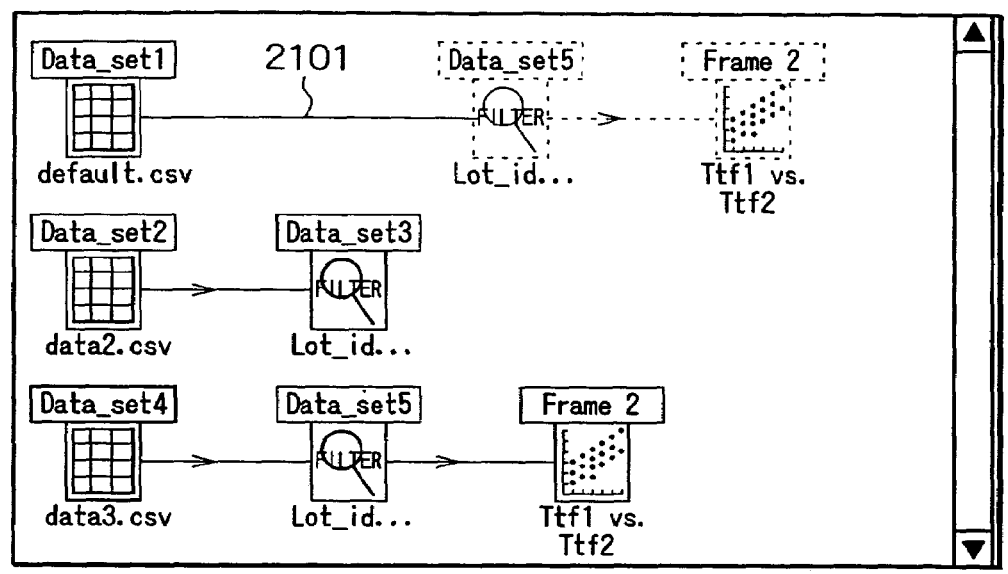
Figure 26:
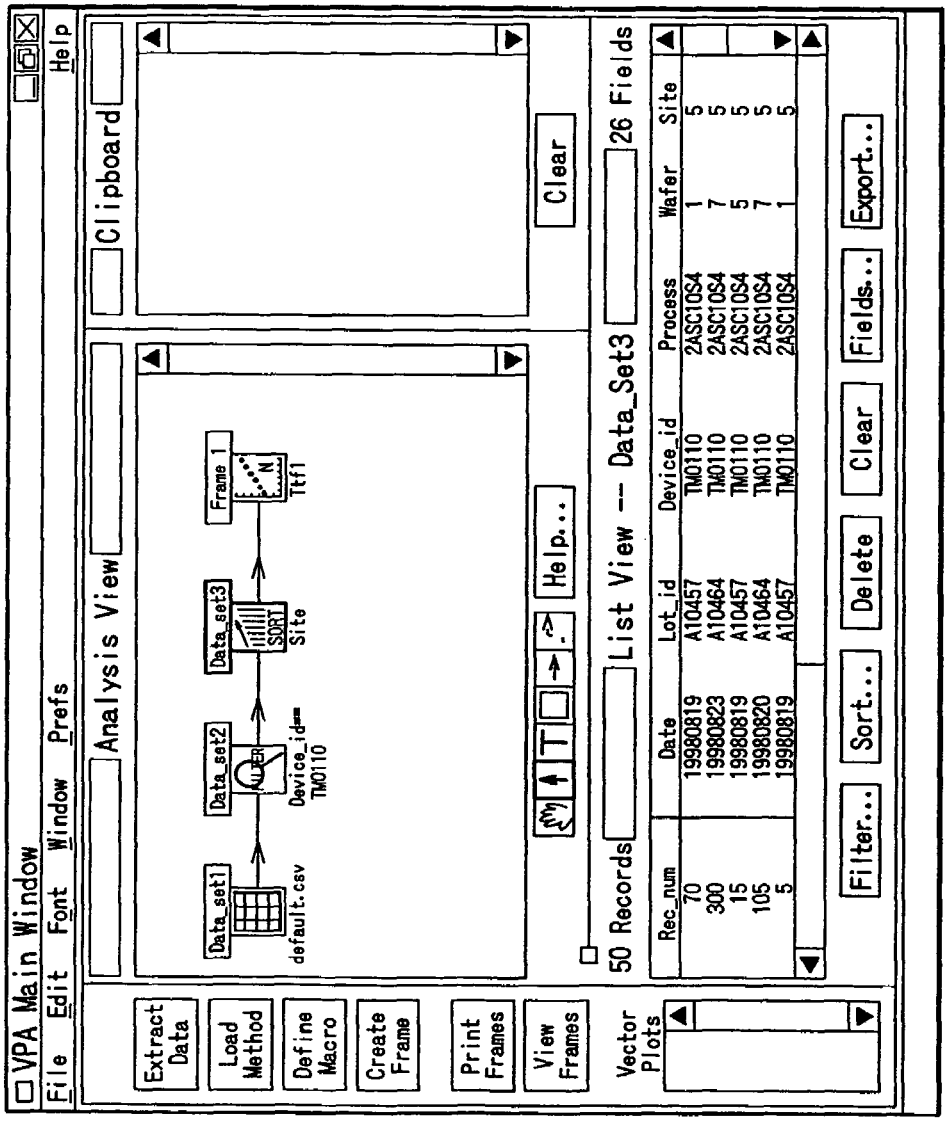
Figure 27:
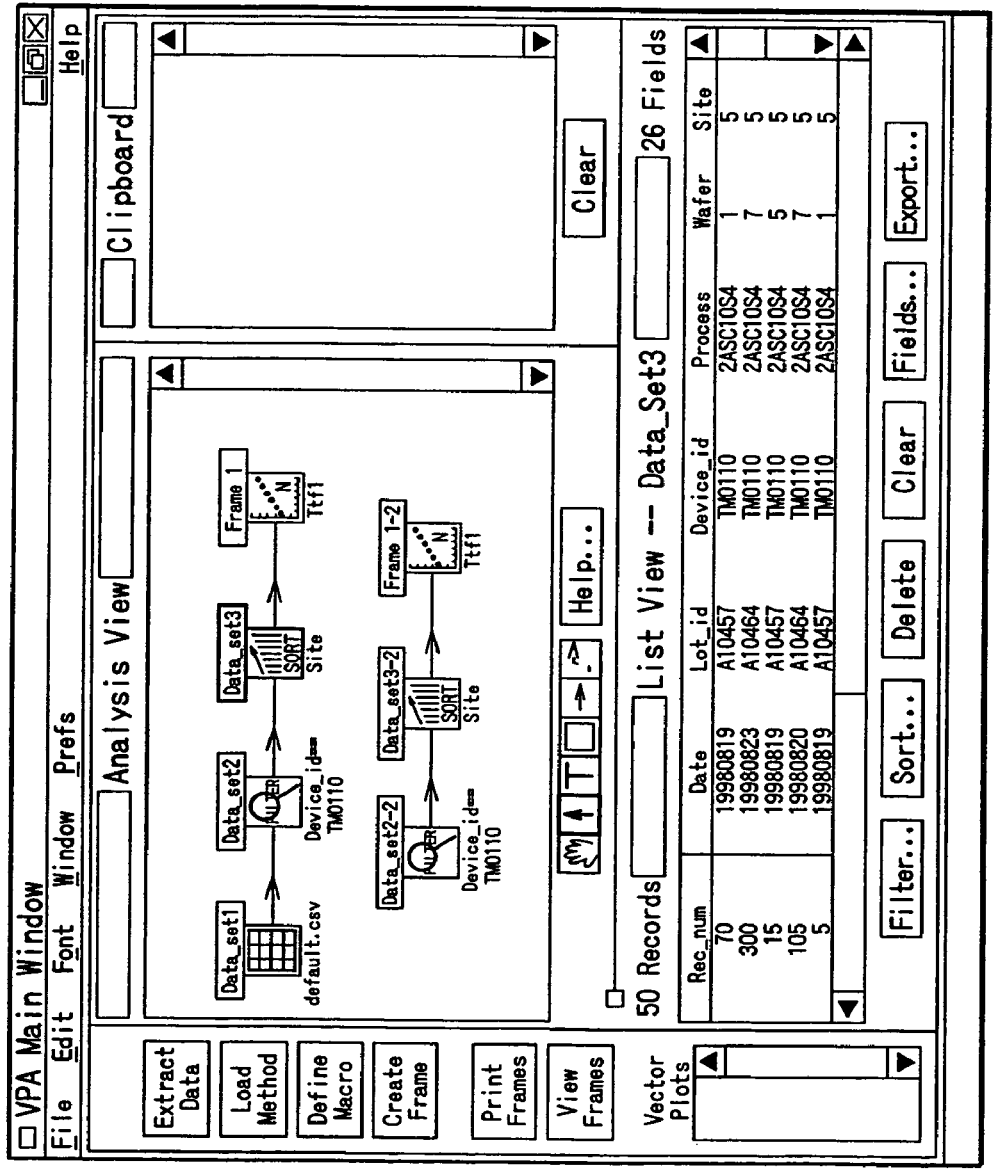

```
┌─────────────────────────────────────┐
│ AS SHOWN IN FIG. 19 AND FIG. 26, FROM│
│    THE HISTORY WINDOW THE MOUSE     │
│      IS USED TO SPECIFY A RANGE     │
│       OF ICONS JOINED BY ARROWS.    │
└─────────────────────────────────────┘
                  │
                  ▼
┌─────────────────────────────────────┐
│    FROM EITHER FIG. 27 COPY IS      │
│  SELECTED FROM THE EDIT MENU AND    │
│       PASTE IS SELECTED TO GIVE     │
│         AN INSTRUCTION TO COPY.     │
└─────────────────────────────────────┘
                  │
                  ▼
┌─────────────────────────────────────┐
│   THE COPIED ICONS AND ARROWS ARE   │
│    DISPLAYED IN THE HISTORY WINDOW. │
└─────────────────────────────────────┘
                  │
                  ▼
┌─────────────────────────────────────┐
│  AS SHOWN IN FIG. 20, IN THE CASE IN│
│    WHICH THE MOST BASIC DATA SET OF │
│  THE PASTED ICONS IS NOT CONNECTED  │
│   TO A DATA SET, AS INDICATED BY THE│
│   ARROW FROM DATA_SET1 TO DATA_SET5 │
│   IN FIG. 21 THE MOUSE IS DRAGGED AFTER│
│  SELECTING THE -> BUTTON SO AS TO SPECIFY│
│  ANOTHER ICON (SOURCE, SORT, FILTER)│
└─────────────────────────────────────┘
                  │
                  ▼
┌─────────────────────────────────────┐
│   AS SHOWN IN FIG. 21, THE COPIED   │
│  ICONS AND ARROWS ARE DISPLAYED     │
│         IN THE HISTORY WINDOW.      │
└─────────────────────────────────────┘
```

FIG. 36

LOADING OPERATION INFORMATION

Figure 29:
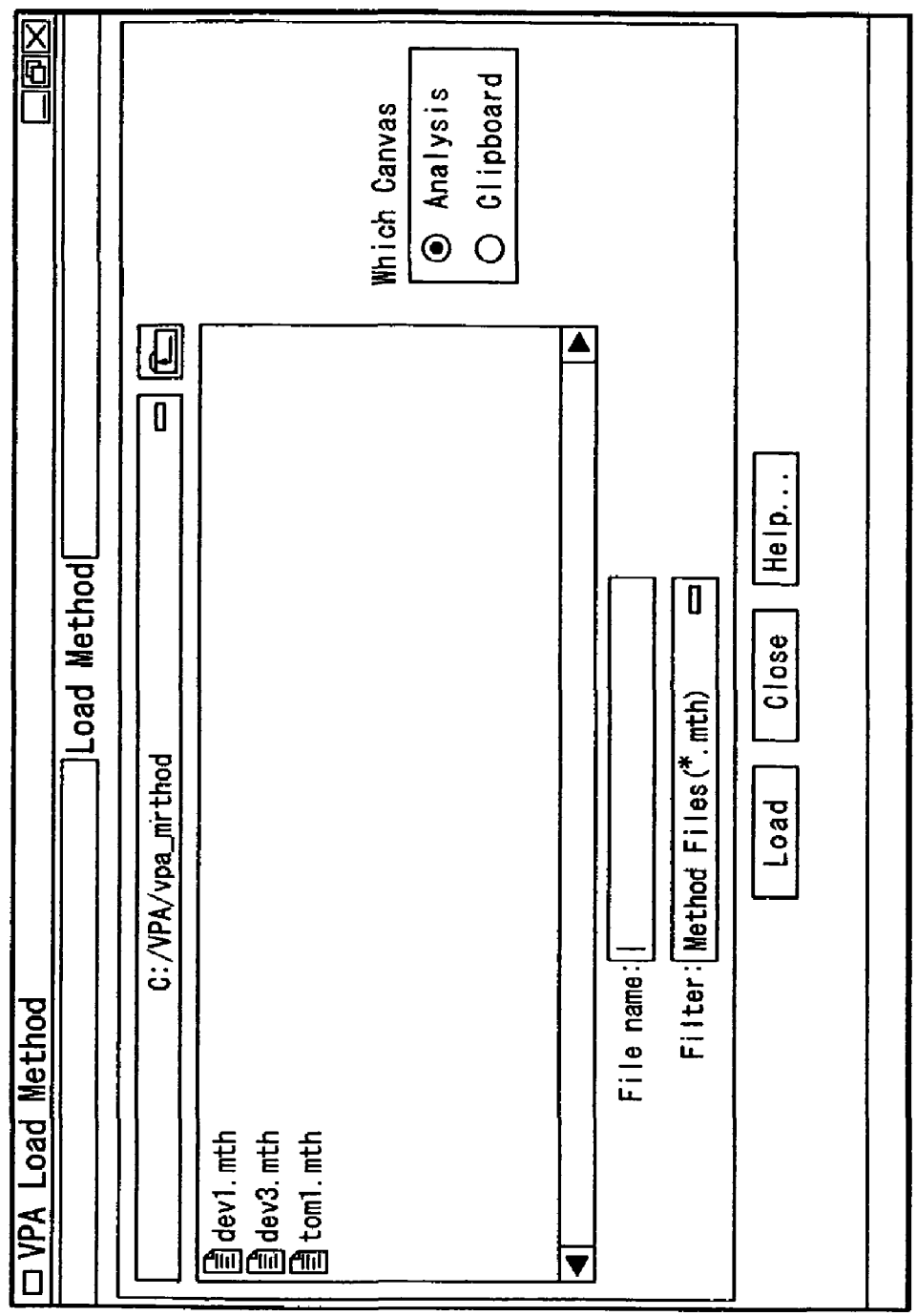

```
THE LOAD METHOD BUTTON SHOWN
IN FIG. 24 IS SELECTED.
            │
            ▼
FROM THE LOAD METHOD WINDOW
SHOWN IN FIG. 29, THE LOAD
METHOD TO BE USED IS SELECTED.
            │
            ▼
THE THREE ICONS AND ARROWS SHOWN
IN FIG. 20 ARE DISPLAYED.
```

FIG. 37

SAVING OPERATION INFORMATION

```
AS SHOWN IN FIG. 19, FROM THE HISTORY
WINDOW AN ICON (OR PLURALITY OF
SELECTED ICONS) TO BE SAVED IS SELECTED
            │
            ▼
THE DISPLAY FOR THE
SELECTED REGION CHANGES.
            │
            ▼
SAVE METHOD IS SELECTED FROM
THE FILE MENU IN THE TOOL BAR.
            │
            ▼
THE FILE NAME IS THEN SPECIFIED,
AND THE SAVE BUTTON IS SELECTED.
```

CHANGING PARAMETERS

OVERLAPPING DISPLAY DATA

SEMICONDUCTOR TEST DATA ANALYSIS SYSTEM

This application is a continuation of U.S. patent application, Ser. No. 10/186,171, filed on Jun. 28, 2002 now U.S. Pat. No. 6,898,545.

BACKGROUND OF THE INVENTION

1. Field of the Invention

The present invention relates to analysis of semiconductor test data, and more particularly to a semiconductor test data analysis system, which, by visually rendering analysis operations such as analysis conditions and analysis procedures with respect to test data, facilitates the setting or changing of analysis operations by the user.

2. Related Art

In analysis operations performed using a dedicated semiconductor analysis software, such as IDS Software Systems' dataPOWER®, analysis results are obtained by loading and analyzing test data, in accordance with commands in such a software. This type of analysis operation can be performed any number of times, with varied analysis conditions or procedures. Because the analysis conditions or procedures are usually stored in a file, it is possible for a user to perform batch processing by specifying a data file. By executing batch processing, it is not necessary for the user to repeatedly input the analysis conditions or procedure for each set of test data to be analyzed.

In the same manner as the above-noted prior art, in general-purpose spreadsheet software, such as Microsoft Excel®, it is possible to execute loading of test data, analysis conditions, and analysis procedures related to the loaded test data, in accordance with software commands, thereby obtaining results of the analysis. Such software has a function which automatically saves analysis conditions and procedures executed by a user from a display apparatus. Using such software to execute batch processing, it is possible for a user to obtain further information regarding test data analysis, based on automatically stored analysis conditions and procedures.

Because of the difficulty of predicting test data at the initial stage of semiconductor manufacturing development, trial-and-error analysis is used to determine the optimal analysis conditions or procedures. In analysis operations such as this, it is often desirable to analyze results obtained from previous analysis operations or to execute a further analysis operation based on results obtained by a previous analysis operation.

In conventional analysis operations, however, no management is done of the history of analysis operations, such as the analysis conditions or procedures of test data executed by software. For this reason, unless the user purposefully saves intermediately obtained analysis results of an analysis operation, it is generally difficult to re-acquire results obtained midway during an analysis operation or to re-acquire data obtained from a previous analysis operation. It is therefore generally not easy to perform further trial-and-error analysis of data based on intermediate analysis results or based data obtained by a previous analysis operation.

At a late stage in semiconductor manufacturing development, because the obtained test data can be predicted quite well, the analysis conditions and procedures required to analyze this data may virtually be determined. The batch processing of analysis operations is automated using these analysis conditions and procedures. In conventional analysis operations using the dedicated analysis software for semiconductor test data, it is necessary for a user to input batch processing commands conforming to a coding method of the particular software used in the analysis, meaning that the user needed to understand the coding method called for by the analysis software in generating the commands for batch processing. It is therefore not easy for the user to generate batch processing commands.

In trial-and-error analysis of semiconductor test data, analysis operations are frequently performed with a partial change in the analysis conditions or analysis procedure. For this reason, there is a need in batch processing for the user to be able to easily make partial changes to the analysis conditions or analysis procedure. In analysis operations of the past using the dedicated analysis software such as described above, however, it is necessary for the user to code batch programming in conformance with a coding method called for by the particular software used in the batch processing, so that execution of batch processing therefore requires specialized knowledge regarding batch processing coding. It is therefore not easy for a user to make partial changes to analysis conditions or analysis procedures.

It is possible with general-purpose spreadsheet software to perform automatic recording of analysis conditions and procedures in analysis operations. Even with this type of software, however, it is not possible to obtain or to manage test data analysis results or data obtained midway in the execution of automatically recorded analysis conditions or analysis procedures. In trial-and-error analysis, when analysis results or analysis data obtained midway in an analysis operation are to be accessed, it is necessary for the user to intentionally save the analysis results or data obtained during in an analysis operation. It is further necessary for the user to code the automatically recorded analysis conditions or procedures in accordance with the method specifically called for by the software. It was therefore not easy for a user to make a partial change in the automatically recorded analysis conditions or procedures.

Accordingly, it is an object of the present invention to provide a semiconductor test data analysis system in which it is possible to automatically record and easily access analysis conditions or an analysis procedure executed by an analysis operation, and further in which it is possible to easily change the settings of analysis conditions, the settings of analysis procedures, or the settings of batch processing and re-execute the analysis with the changed conditions or settings.

SUMMARY OF THE INVENTION

The present invention provides semiconductor test data analysis system which, during an analysis operation, automatically records operation information of the analysis operation, including analysis conditions or an analysis procedure for input test data, or analysis information obtained by the analysis operation.

More specifically, one preferred aspect of the present invention is a semiconductor test data analysis system that automatically records operation information of the analysis operation, including analysis conditions or procedures for input test data, or analysis information obtained by the analysis operation, the system includes: processing means; analysis target data storage means for storing the test data as analysis target data; a historical data storage means for storing as historical data at least one of operation information of the analysis operation or analysis information obtained by the analysis operation; and display data storage means for storing analysis information obtained by the analysis operation, which stores analysis display data generated by the processing means, wherein when a new analysis operation is specified, the processing means processes the input test data in accordance with the newly specified analysis operation, information of at least one of analysis target data, historical data, and display data being processed by the newly specified analysis operation.

Another preferred aspect of the present invention is a semiconductor test data analysis system in which the processing means comprises reading test data from database or data file, and storing the test data as analysis target data in the analysis target data storage means by the newly specified analysis operation.

Another preferred aspect of the present invention is the semiconductor test data analysis system in which the processing means comprises processing the analysis target data by the newly specified analysis operation.

Another preferred aspect of the present invention is the semiconductor test data analysis system in which processing analysis target data further comprises filtering or sorting processing.

Another preferred aspect of the present invention is the semiconductor test data analysis system in which operation information of the newly specified analysis operation or analysis target data related to the analysis information is further stored as new analysis target data in the analysis target data storage means.

Yet another preferred aspect of the present invention is the semiconductor test data analysis system wherein the operation information of the newly specified analysis operation or historical data related to the analysis information is stored as new historical data in the historical data storage means.

Still another preferred aspect of the present invention is the semiconductor test data analysis system wherein operation information of the newly specified analysis operation or display data related to the analysis information is stored as new display data in the display data storage means.

Another preferred aspect of the present invention is the semiconductor test data analysis system which copies, synthesizes, or integrates operation information or analysis information concerning at least one of a database, a data file, the analysis target data, the historical data, and the display data, so as to generate new operation information or analysis information.

Another preferred aspect of the present invention is the semiconductor test data analysis system further including a display apparatus.

Yet another preferred aspect of the present invention further includes an input apparatus.

The present invention also provides a semiconductor test data analysis system in which the display apparatus displays at least one of a data window related to analysis target data stored in the analysis target data storage means, a history window related to historical data stored in the historical data storage means, a display window related to display data stored in the display data storage means, and a plurality of icons, which display or specify either operation information of the analysis operation or analysis information.

Another preferred aspect of the present invention is one in which the plurality of icons includes any one of:

means for displaying or making a selection related to operation information of the analysis operation, means for displaying or making a selection related to analysis information of the analysis operation, means for generating an indicator representing a relationship between the means for displaying or making a selection related to operation information of the analysis operation and means for displaying or making a selection related to analysis information of the analysis operation, and□means for displaying or making a selection for visually rendering analysis information of the analysis operation.

Another preferred aspect of the present invention is one wherein when specification is made of an icon among the plurality of icons, subsequent analysis target data in the analysis operation associated with that icon is further specified.

Yet another preferred aspect of the present invention is one wherein when specification is made on an icon among the plurality of icons, the analysis operation associated with that icon is automatically re-executed.

Another preferred aspect of the present invention is one wherein at least one icon among the plurality of icons starts batch processing associated with that icon.

Another preferred aspect of the present invention is one further including means whereby, when a plurality of icons associated with the analysis operation are specified, the data specified by each of the respective icons is copied, synthesized, or integrated.

Yet another preferred aspect of the present invention is one further having means whereby when the plurality of icons related to visual rendering of data are related to one another, analysis information obtained by an analysis operation specified by one icon and analysis information obtained by an analysis operation specified by another icon are visually rendered and displayed in one and the same window.

The present invention also provides a method for analyzing semiconductor test data which automatically records, during an analysis operation, operation information of the analysis operation, including input test data analysis conditions or analysis procedures, or analysis information obtained by the analysis operation.

More specifically, this method is implemented in a semiconductor test data analysis system which includes processing means, analysis target data storage means, historical data storage means, and display data storage means, and includes steps of: processing test data with the processing means, storing input test data in the analysis target data storage means as analysis data, storing as historical data into the historical data storage means either operation information of the input analysis operation or analysis information obtained by the analysis operation, storing into the display data storage means analysis display data generated by the processing means for display of analysis information obtained by the analysis operation, When a newly specified analysis operation is specified, the processing means processing the input test data in accordance with the analysis operation, and processing information of at least one of the analysis target data, the historical data, or the display data by the new analysis operation.

Another preferred aspect of the method for semiconductor test data analysis of the present invention, wherein processing the test data by the processing means further comprises reading test data from database or data file, and storing the test data as analysis target data in the analysis target data storage means in accordance with the newly specified analysis operation.

Another preferred aspect of the method for semiconductor test data analysis of the present invention, wherein processing using the processing means further comprises processing the analysis target data by a newly specified analysis operation.

Another preferred aspect of the method for semiconductor test data analysis of the present invention, wherein processing using the processing means further comprises filtering or sorting.

Yet another preferred aspect in which operation information of the new analysis operation or analysis target data related to the analysis information is further stored as new analysis target data in the analysis target data storage means.

Another preferred aspect is one wherein the operation information of the new analysis operation or historical data related to the analysis information is stored as new historical data in the historical data storage means.

Yet another preferred aspect is one wherein operation information of the new analysis operation or display data related to the analysis information is stored as new display data in the display data storage means.

Another preferred aspect is one which copies, synthesizes, or integrates operation information or analysis information concerning at least one of a database, a data file, the analysis target data, the historical data, and the display data, so as to generate new operation information or analysis information.

Another preferred aspect is one which further includes a step of displaying on a display apparatus operation information or analysis information of the new analysis operation.

Yet another preferred aspect is one which further includes a step of inputting operation information or analysis information of an analysis operation from an input apparatus.

The present invention also provides a method for analyzing semiconductor test data which further includes a step of displaying on the display apparatus at least one of a data window related to analysis target data stored in the analysis target data storage means, a history window related to historical data stored in the historical data storage means, a display window related to display data stored in the display data storage means, and a plurality of icons, which display or specify either operation information of the analysis operation or analysis information.

In the above case a step of generating the plurality of icons includes any one of: generating means for displaying or making a selection related to operation information of the analysis operation, generating means for displaying or making a selection related to analysis information of the analysis operation, generating means for generating an indicator representing a relationship between the means for displaying or making a selection related to operation information of the analysis operation and means for displaying or making a selection related to analysis information of the analysis operation, and generating means for displaying or making a selection for visually rendering analysis information of the analysis operation.

Another preferred aspect further includes a step whereby when specification is made of an icon of the plurality of icons, subsequent analysis target data in the analysis operation associated with that icon is further specified.

Another preferred aspect further has a step whereby when specification is made on an icon of the plurality of icons, the analysis operation associated with that icon is automatically re-executed.

Another aspect has a further step whereby at least one of the plurality of icons starts batch processing associated with the analysis operation.

Another aspect has a further step whereby when a plurality of icons associated with the analysis operation are specified, the data specified by each of the respective icons is copied, synthesized, or integrated.

Another preferred aspect having a further step whereby when the plurality of icons related to visual rendering of data are related to one another, analysis information obtained by an analysis operation specified by one icon and analysis information obtained by an analysis operation specified by another icon are visually rendered and displayed in one and the same window.

The present invention also provides a computer program for execution by a computer of any of the above-noted methods for analyzing semiconductor test data.

According to the above-noted system or method, because semiconductor test data analysis operations or analysis information is automatically recorded and, if necessary, can be visually rendered and displayed, analysis of semiconductor test data by a user is simplified.

The term "analysis operation" as used herein will be understood to include processing of test data based on operation information established by a user, and also encompass an operation of comparison with this operation information. The term "analysis target data" as used herein will be understood to include test data that is to be subjected to the execution of the above-noted analysis operation.

The term "operation information" as used herein will be understood to include information related to analysis conditions or analysis procedures executed by the above-noted analysis operation. The term "analysis information" as used herein will be understood to include analysis results obtained by the above-noted analysis operation, analysis target data related to these analysis results, a link to these analysis results, or a link to analysis display data of these analysis results.

The term "indicator" as used herein will be understood to include a line, a character, a graphic, color-coding, gradation, or a combination of these elements. The phrase "means for generating an indicator" as used herein will be understood to include, for example, the displaying on the above-noted display apparatus of the above-noted indicator.

The term "icon" as used herein will be understood to include a display means or input means for causing a computer to execute a command related to acquisition, processing, visual rendering, or display of analysis target data, operation information, or analysis information. An icon is normally composed of one or more characters, graphics, or symbols, or a combination thereof. The term icon used herein is not restricted to an icon as would be displayed on the display apparatus of a computer, but will be understood as further including a tool bar or button within a window on a display apparatus. The expression "specify an icon" as used herein will be understood to mean the selection of an icon, which includes, as noted above, a tool bar or a button, by means of an input operation from a keyboard, an input operation from a touch-panel, or selection using a mouse or other pointing-type input device.

The term "computer" used herein will be understood to include a data input means such as a keyboard, mouse, or touch-panel, a storage means, such as a semiconductor memory (hereinafter simply referred to as memory) or a hard disk drive or other types of drives for storing input data, a processing means for processing or analyzing input data or stored data, and a display means for displaying on a display apparatus input data or processed data. In this case, commands relating to analysis target data, operation information, or analysis information need not be input at the computer, but can be communicated to the computer via a communication means such as a LAN or the Internet. Such analysis target data, operation information, or analysis information can be stored in a storage means, such as the memory or hard disk drive of the computer.

When the analysis target data, operation information, or analysis information is stored in the storage means of the computer, a processing means such as a CPU (center processing unit) processes the analysis target data, operation information, or analysis information in accordance with instructions from a system control program within the computer. The results of this processing are displayed on a display apparatus. Therefore, the "computer" of the present invention includes, for example, a data acquisition means for storage, saving, reading, and writing of analysis target data, operation information, or analysis information data, a data processing means for performing data filtering, sorting, joining, or product or sum calculations, and a data visual rendering means for generating and displaying a graphic or table for extracting characteristics of analysis target data or analysis information.

BRIEF DESCRIPTIONS OF THE DRAWINGS

Figure 1:
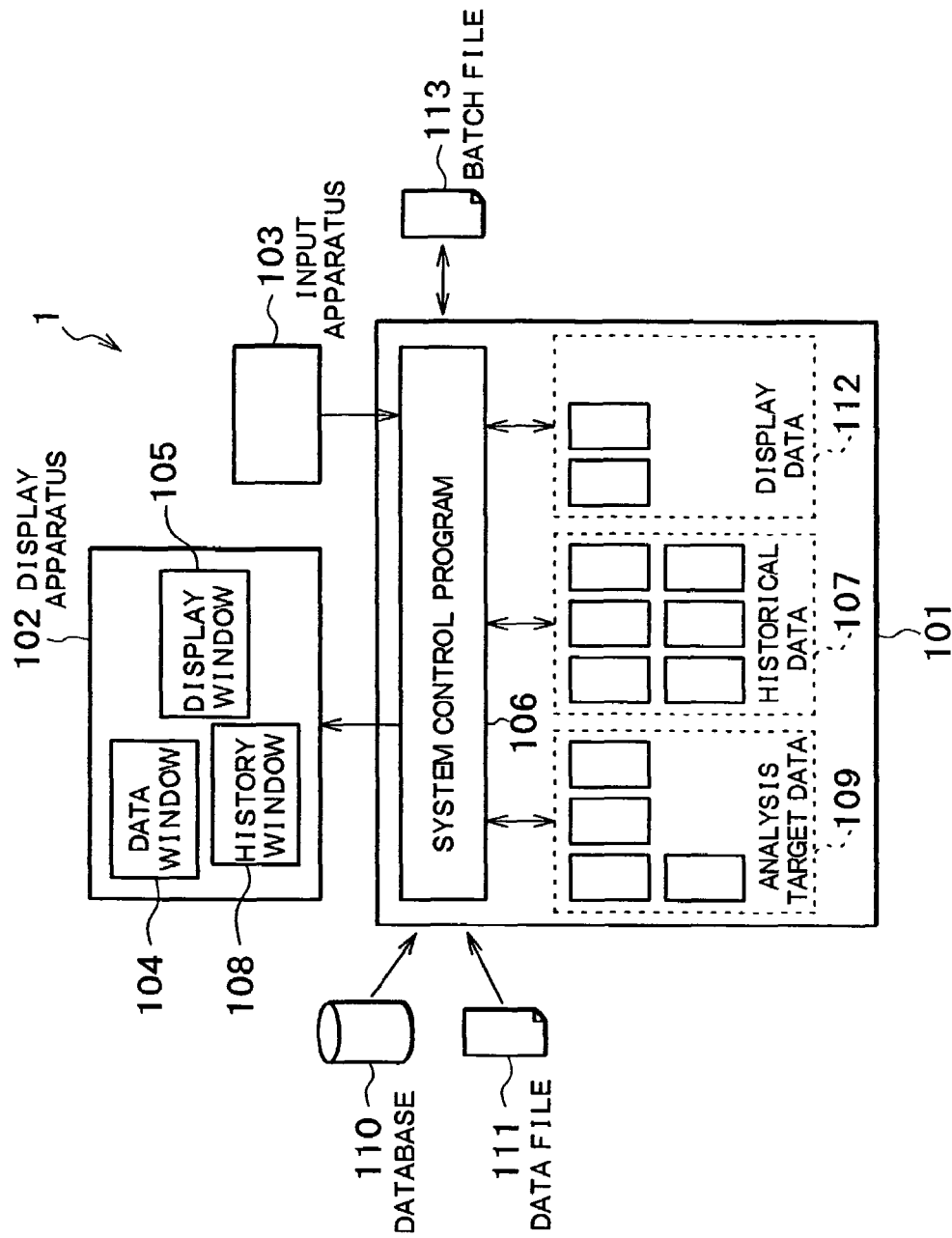
Figure 3:
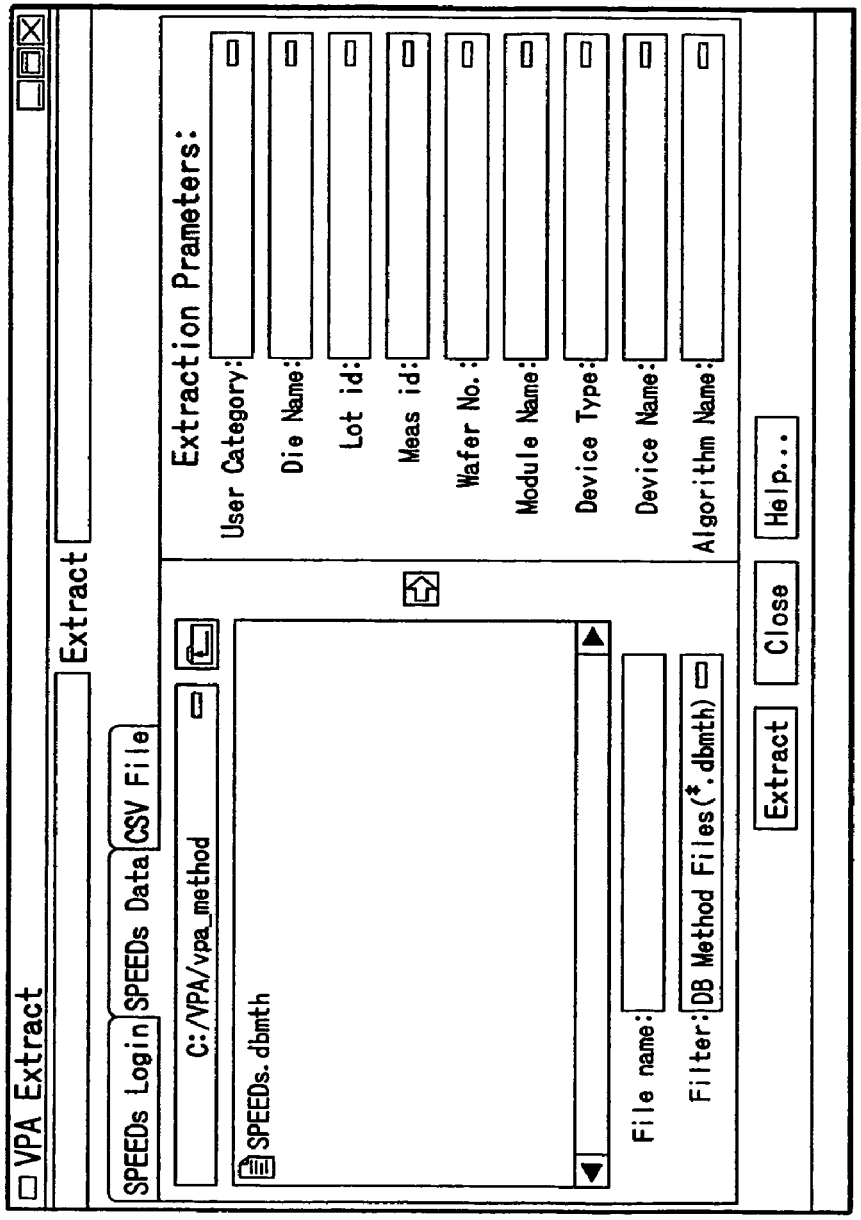
Figure 4:
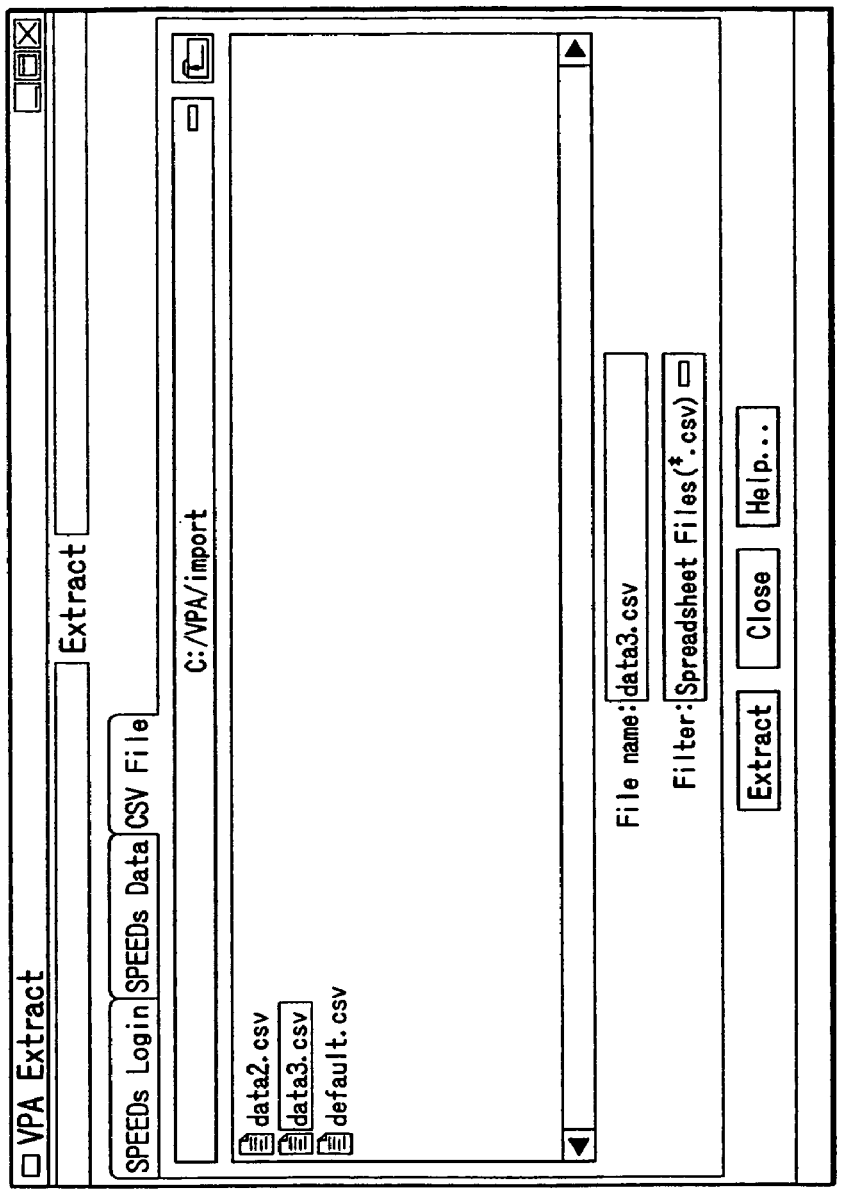
Figure 7:
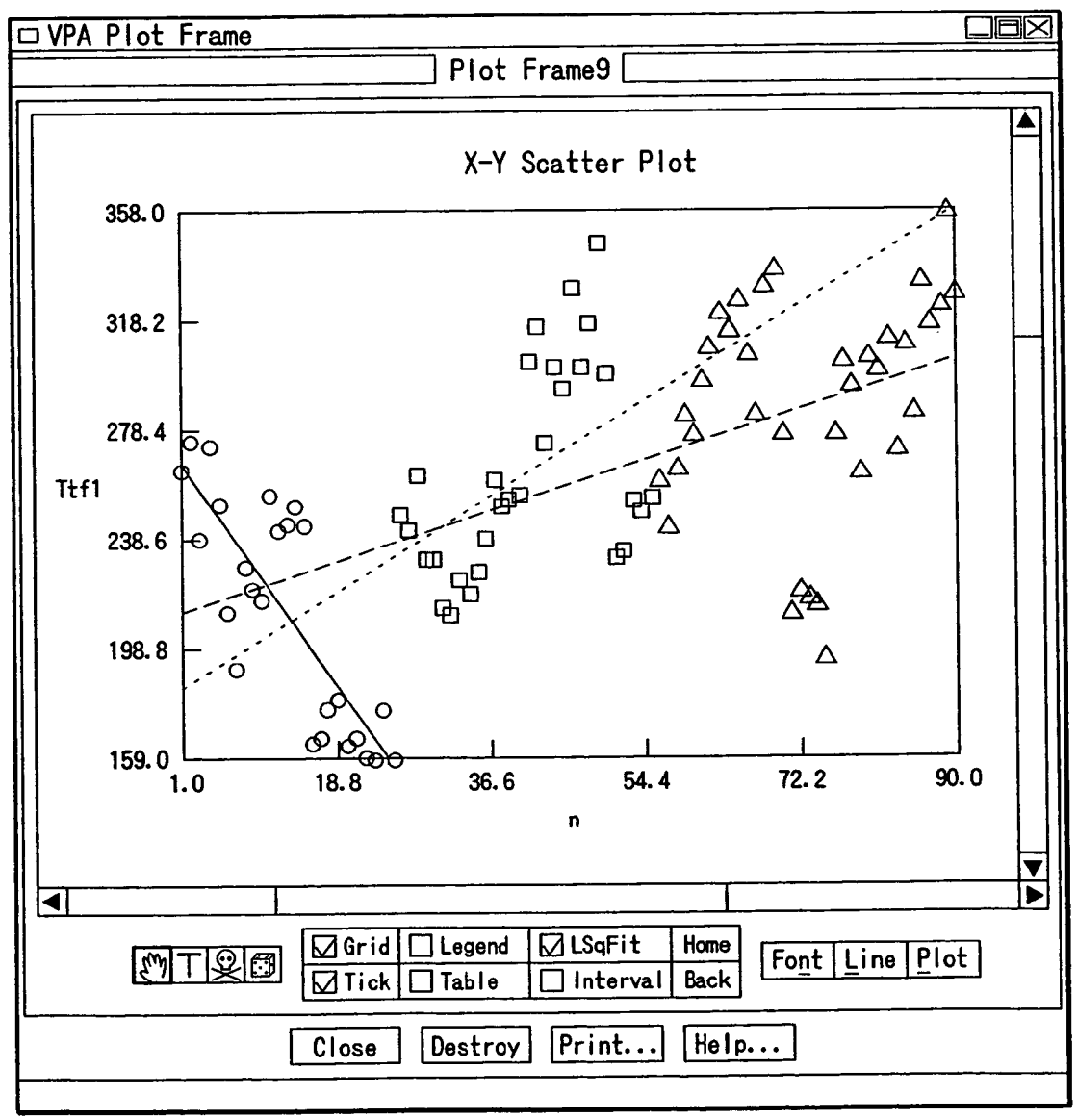
Figure 8:
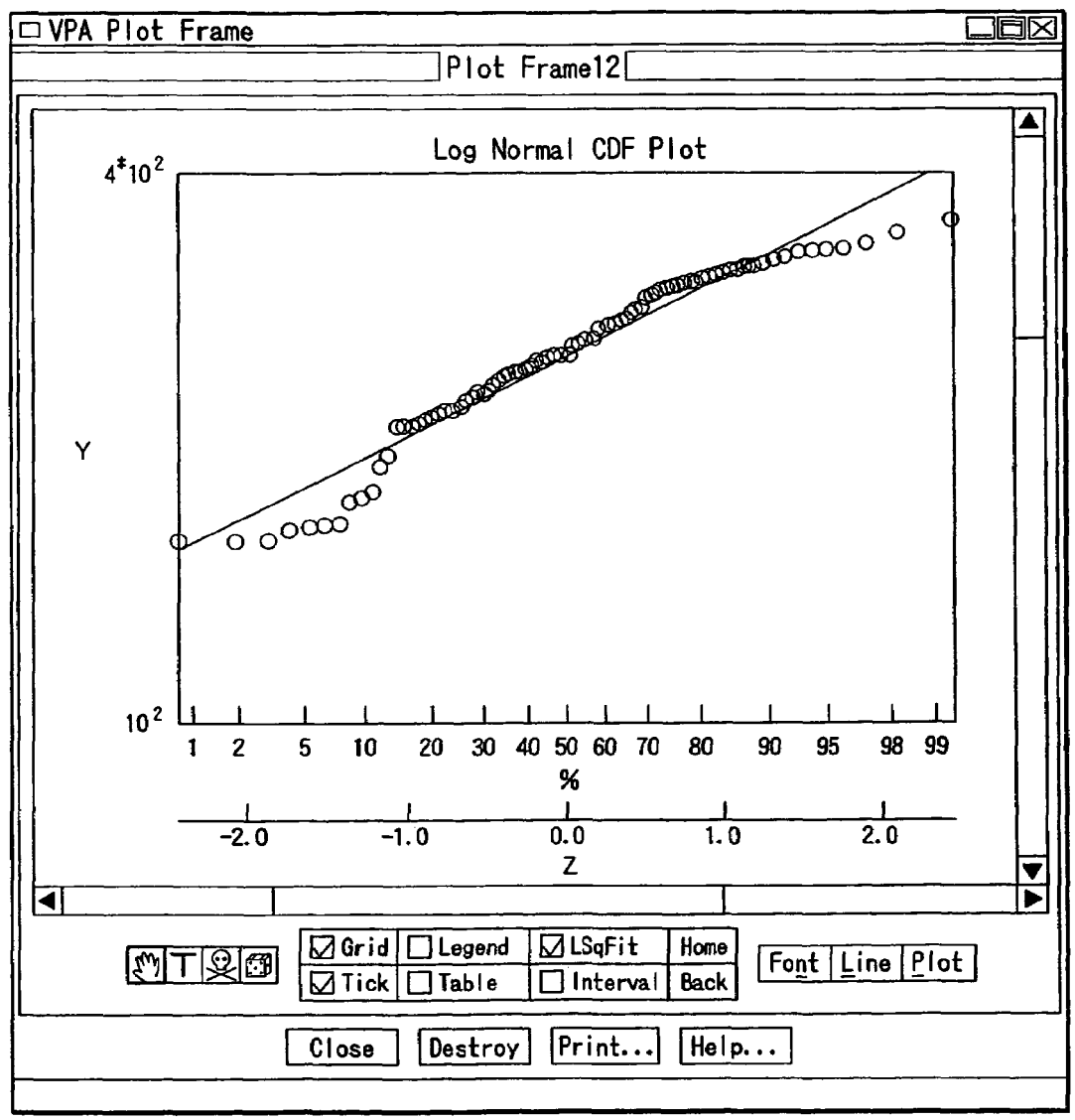
Figure 9:
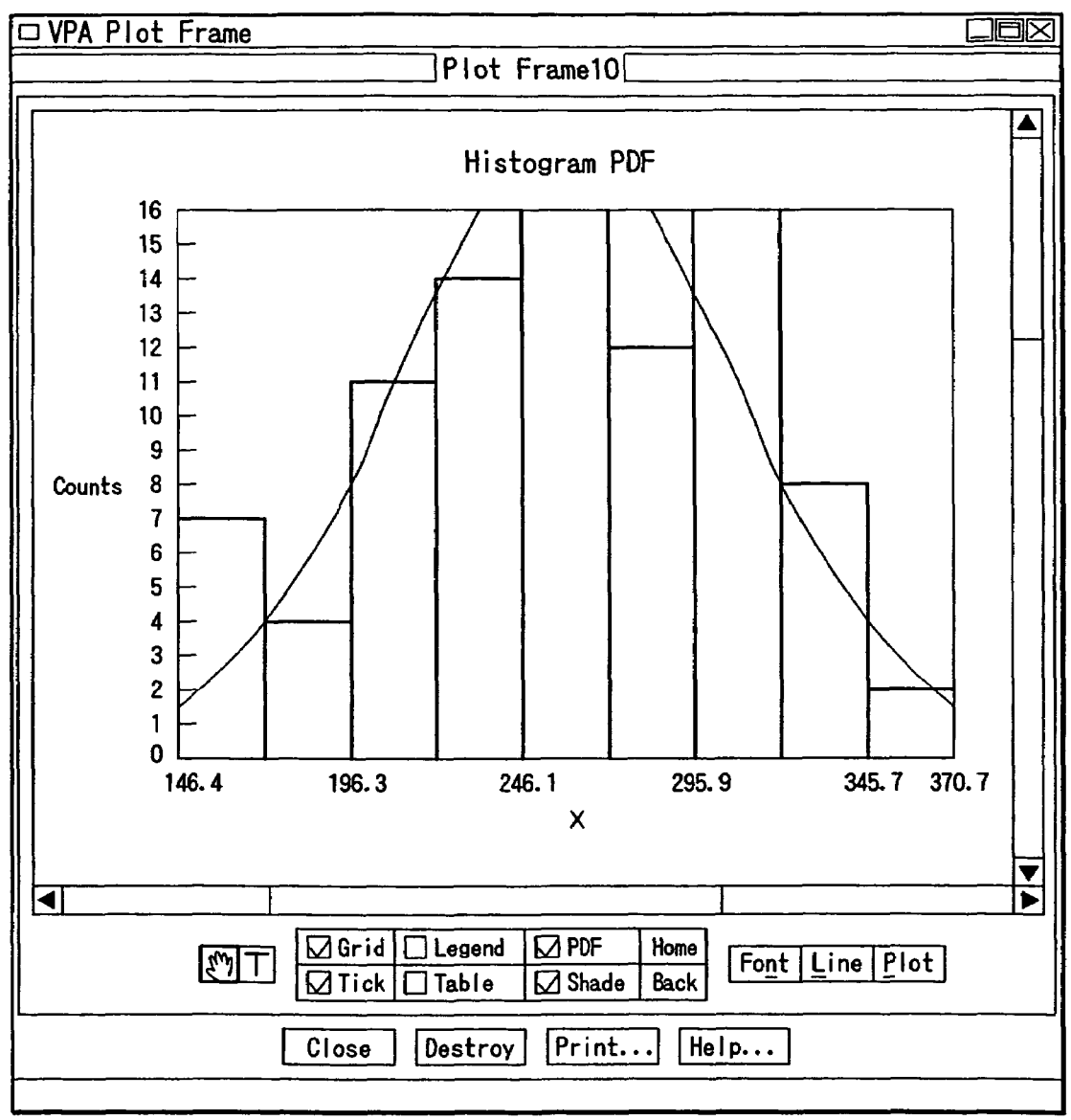
Figure 10:
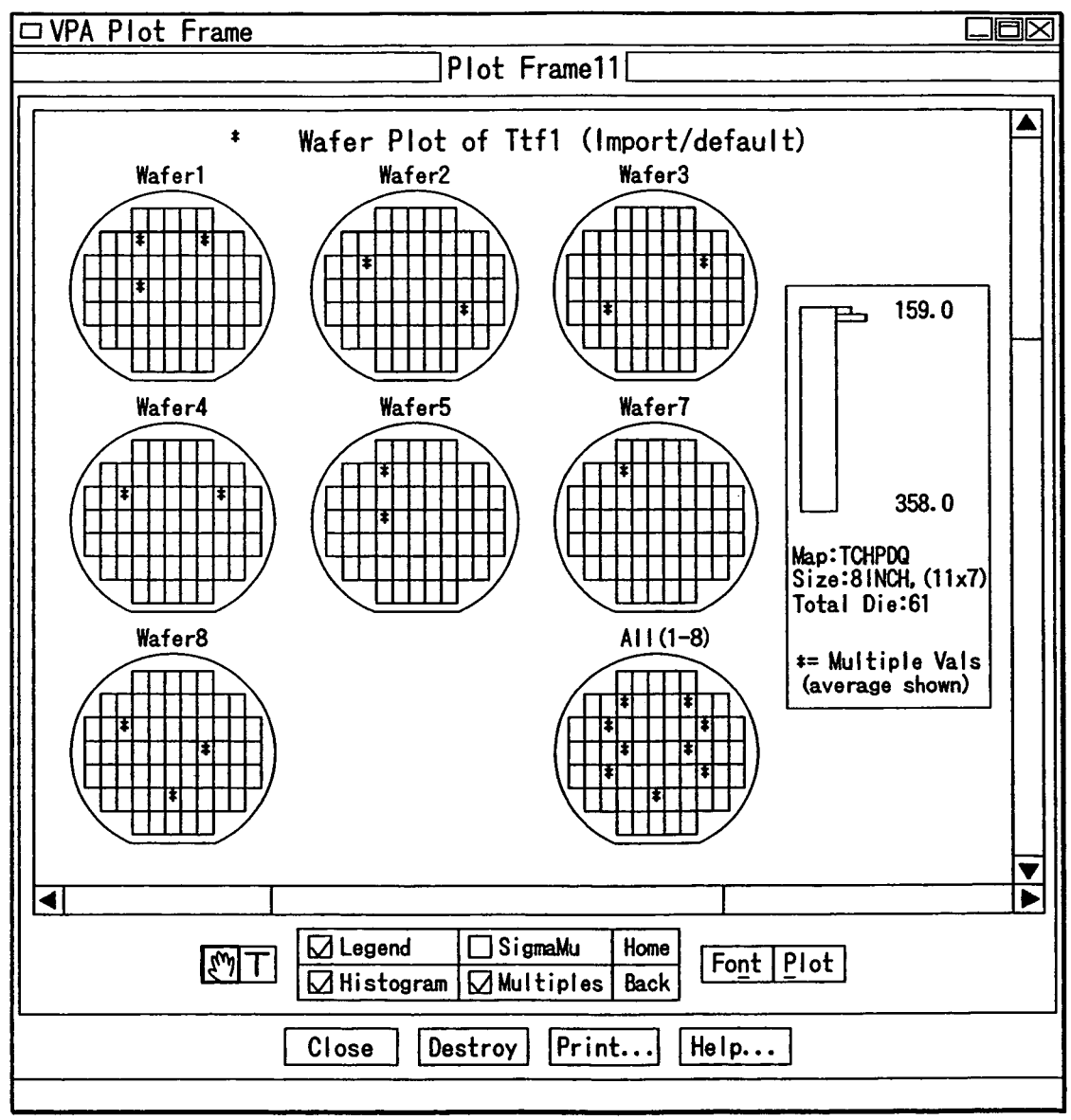
Figure 11:
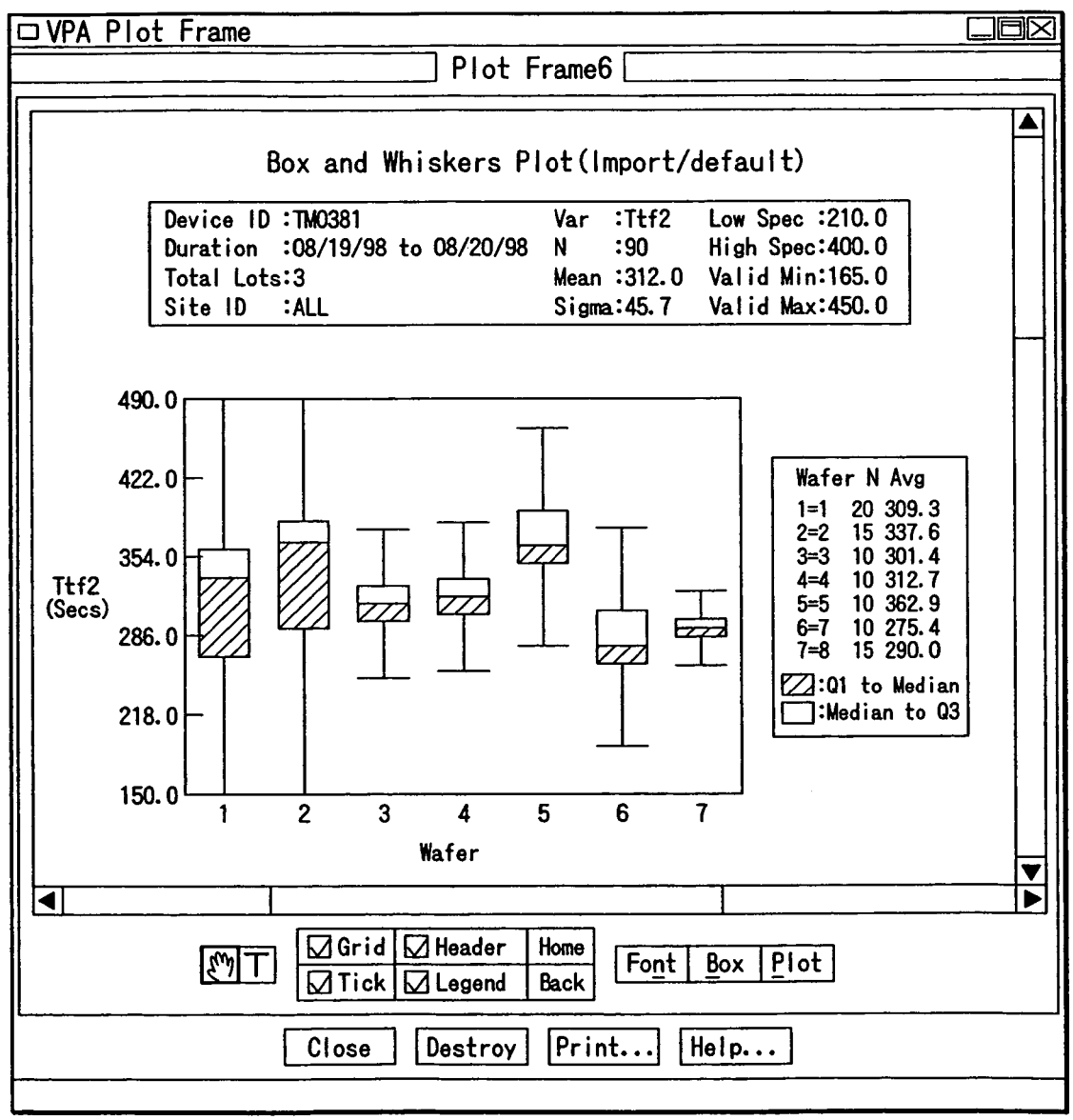
Figure 12:
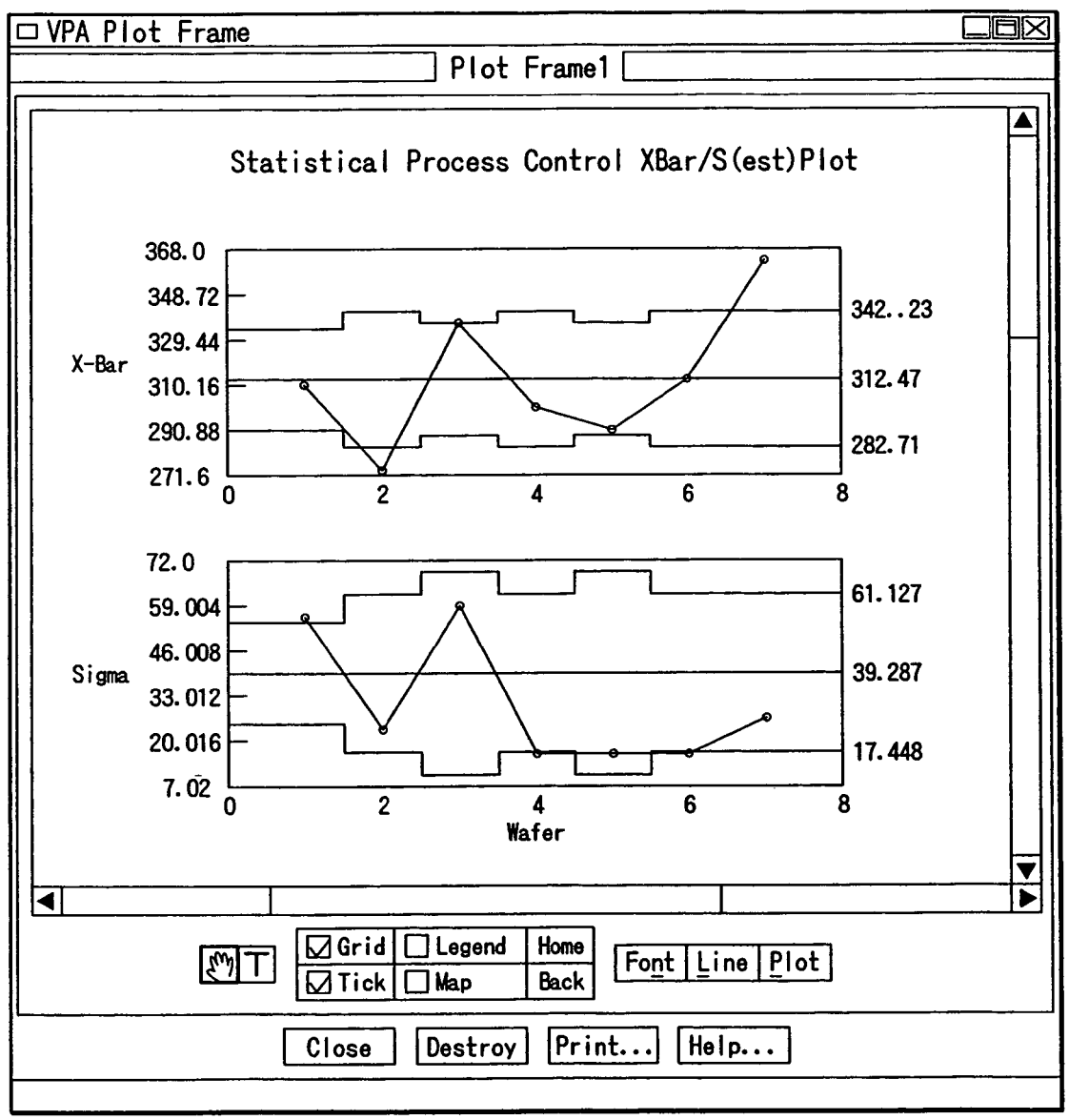
Figure 13:
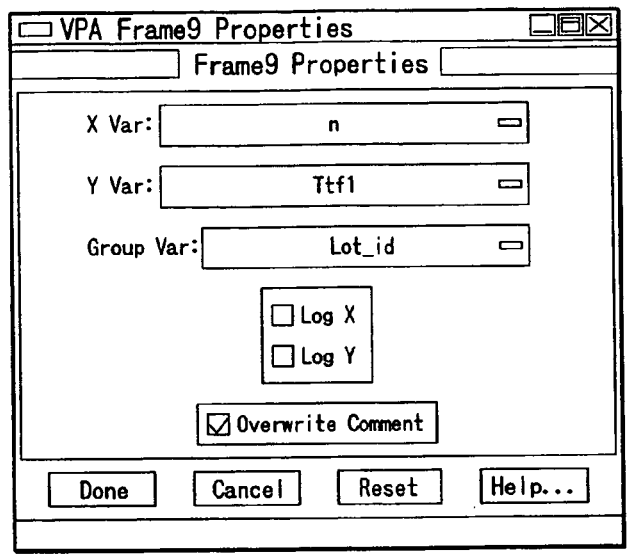
Figure 14:
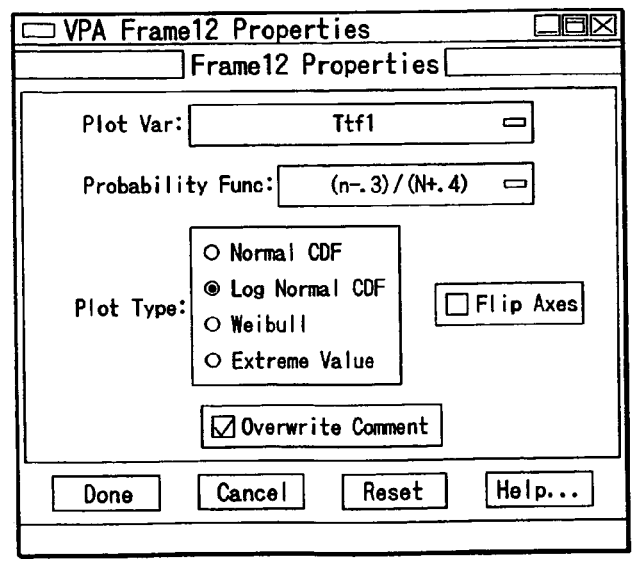
Figure 15:
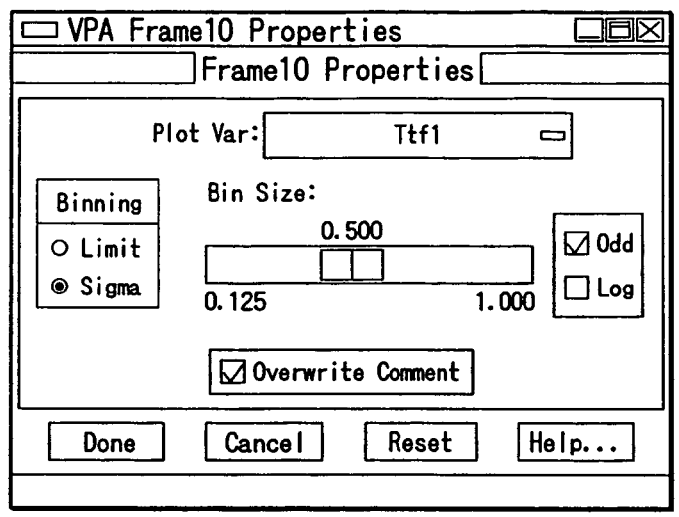
Figure 16:
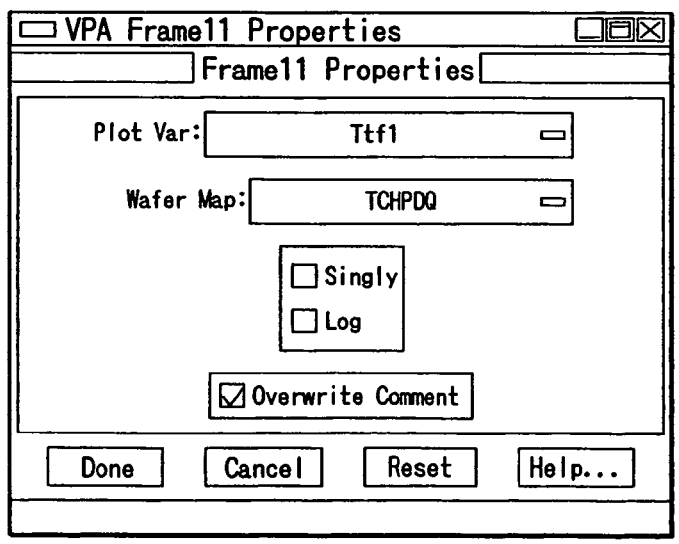
Figure 17:
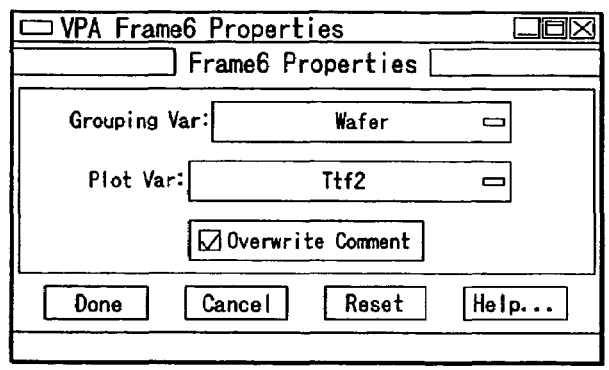
Figure 18:
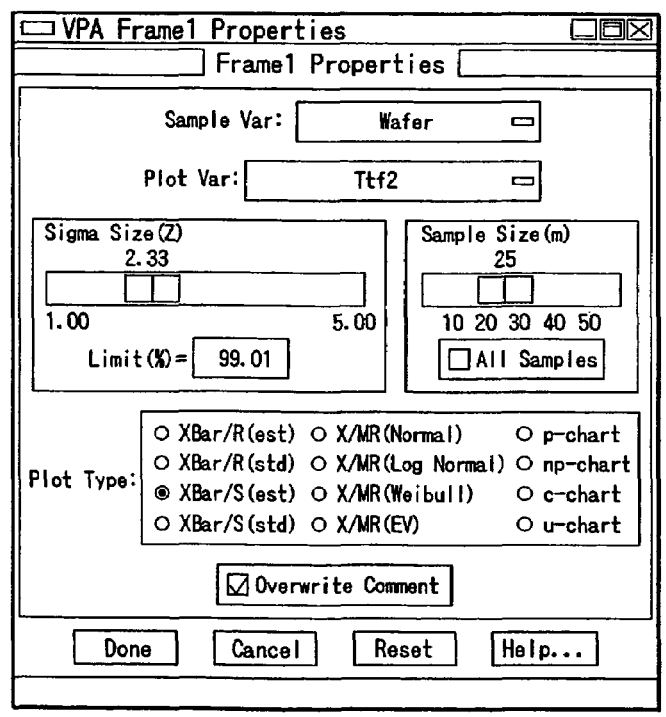
Figure 22:
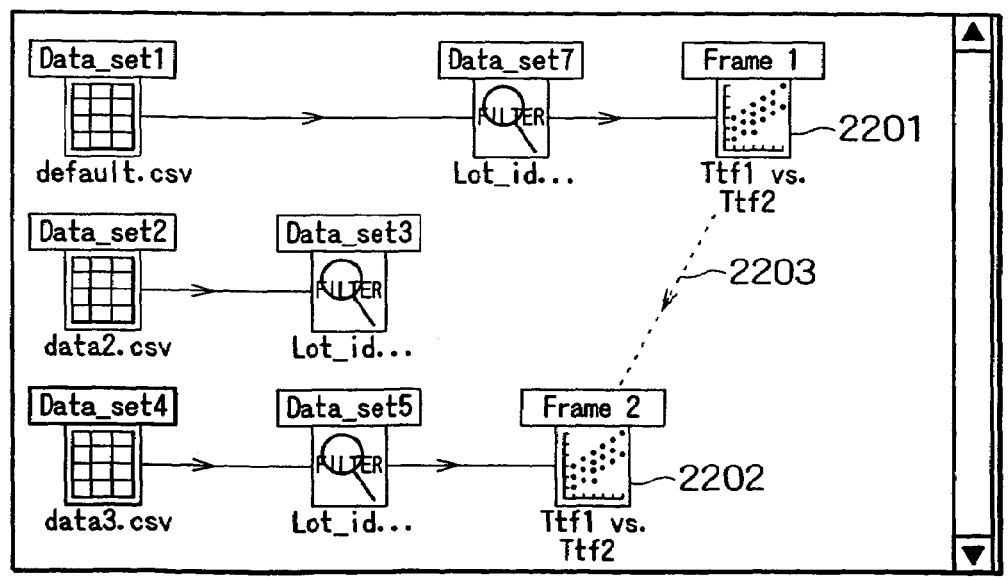
Figure 25:
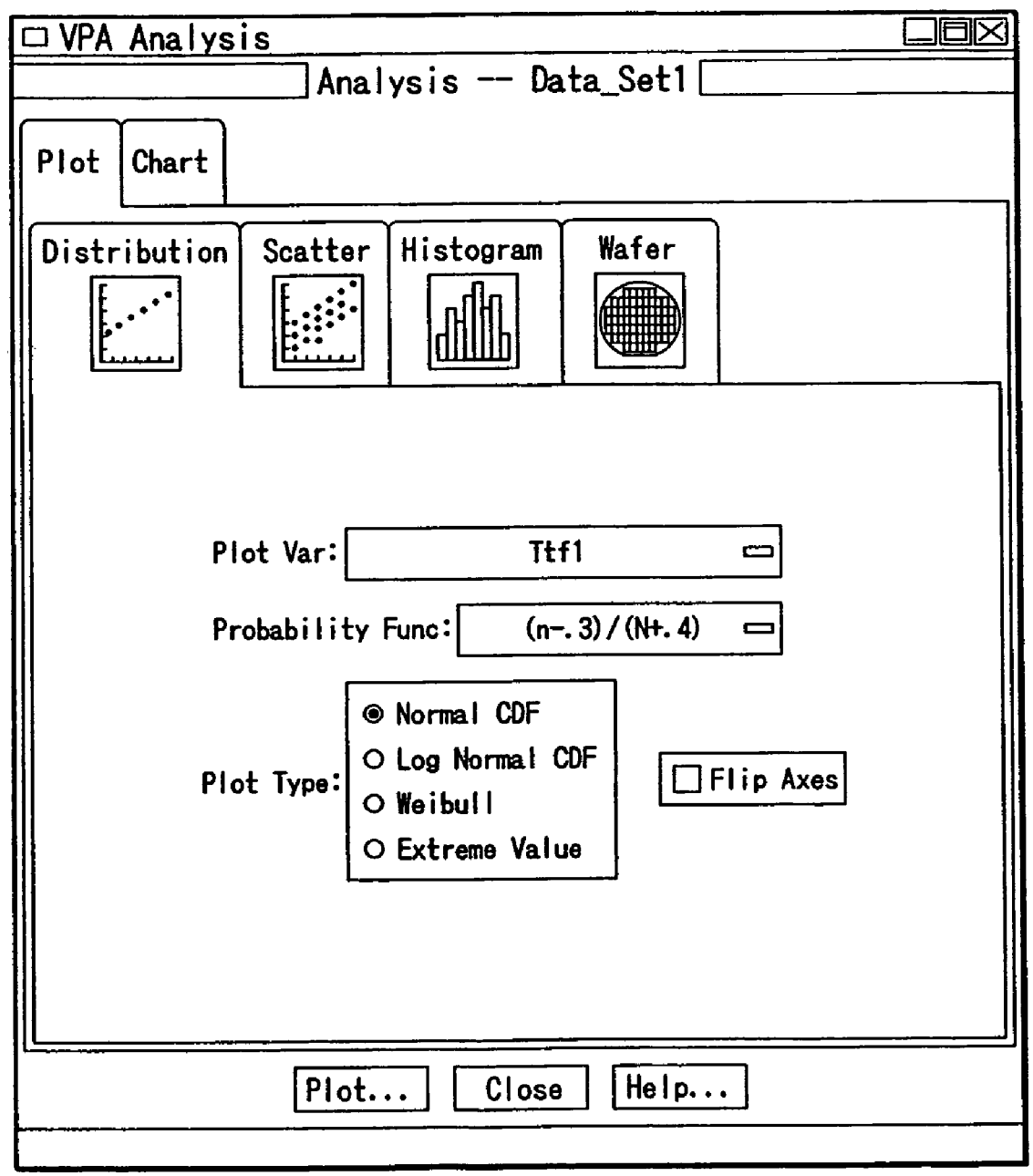
Figure 28:
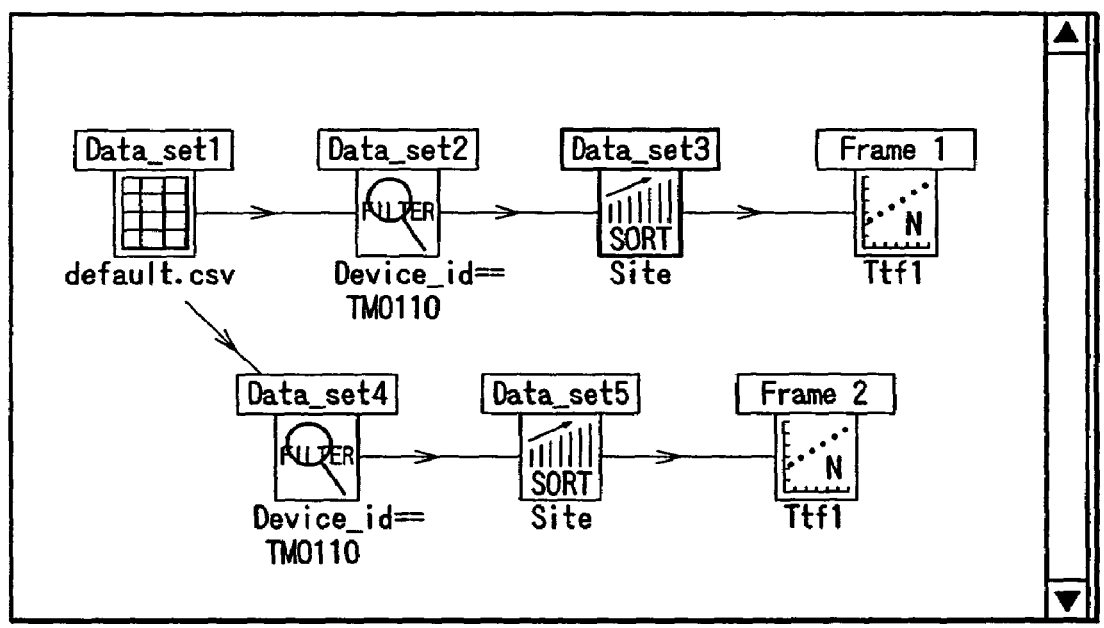
Figure 30:
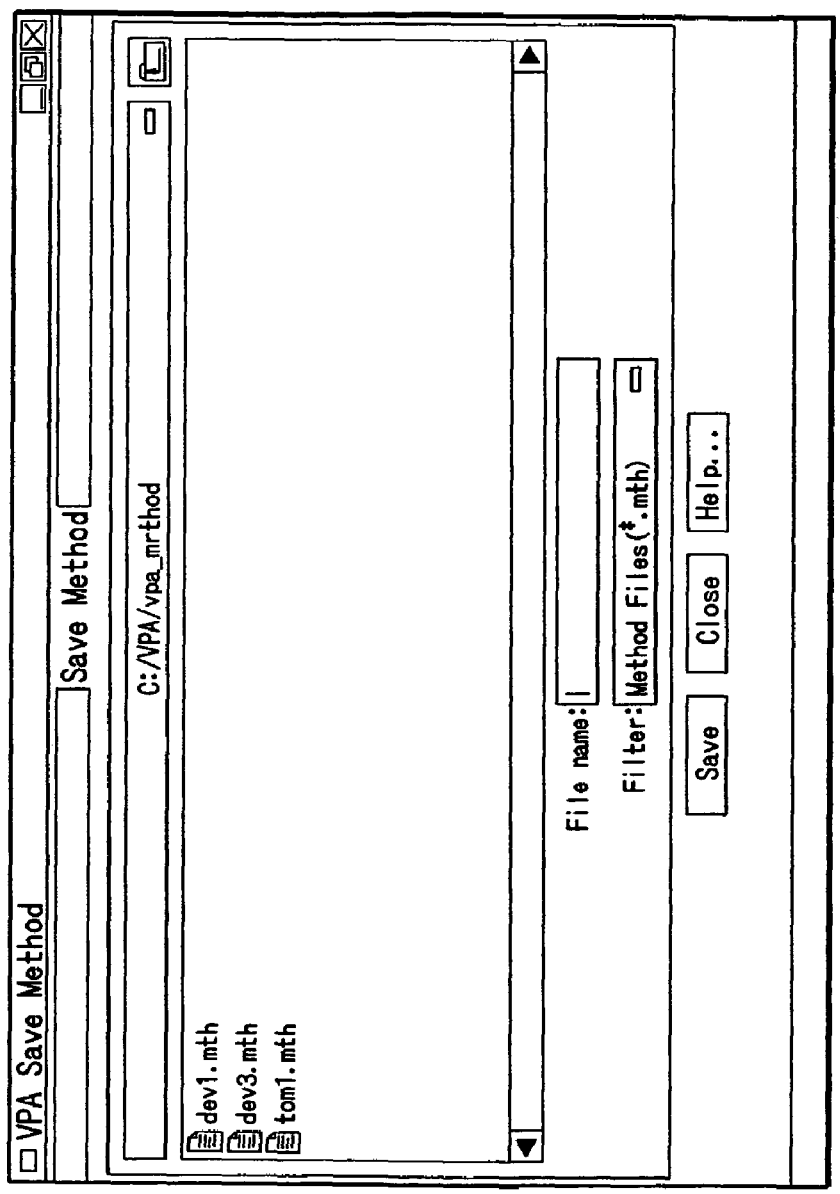
Figure 38:
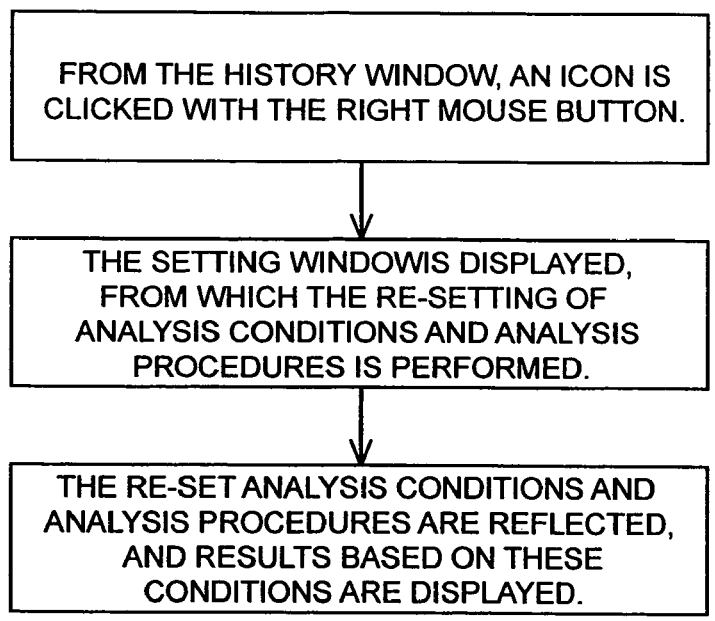
Figure 39:
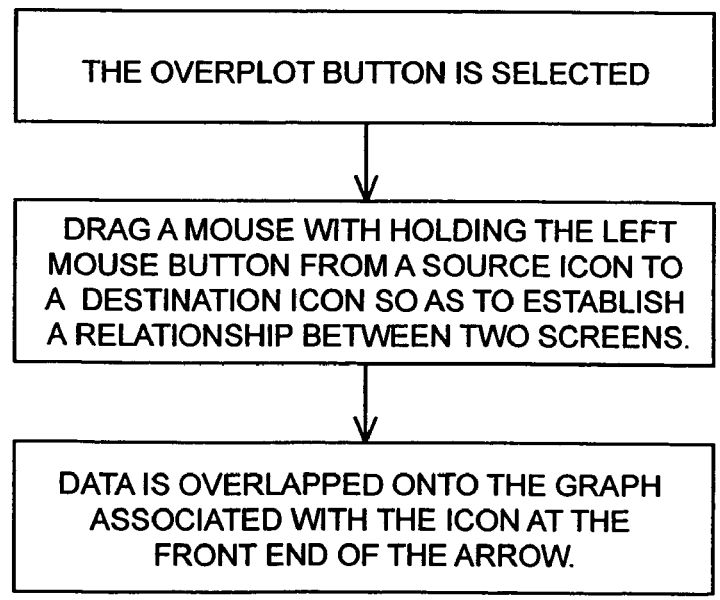

FIG. 1 is a drawing showing a system configuration;
FIG. 2 is a drawing showing a history window;
FIG. 3 is a drawing showing a database search condition setting window;
FIG. 4 is a drawing showing a data file specification window;
FIG. 5 is a drawing showing a data filtering conditions specification window;
FIG. 6 is a drawing showing a sorting conditions specification window;
FIG. 7 is a drawing showing a scatter plot;
FIG. 8 is a drawing showing a cumulative distribution plot;
FIG. 9 is a drawing showing a histogram;
FIG. 10 is a drawing showing a wafer map;
FIG. 11 is a drawing showing a box and whiskers plot;
FIG. 12 is a drawing showing an SPC (Statistical Process Control) plot;
FIG. 13 is a drawing showing a scatter plot setting window;
FIG. 14 is a drawing showing a cumulative distribution plot setting window;
FIG. 15 is a drawing showing histogram setting window;
FIG. 16 is a drawing showing a wafer map setting window;
FIG. 17 is a drawing showing a box and whiskers plot setting window;
FIG. 18 is a drawing showing an SPC plot setting window;
FIG. 19 is a drawing showing the use of a mouse to specify an icon to be copied;
FIG. 20 is a drawing showing copied icons and a copied line;
FIG. 21 is a drawing showing joining of an icon representing analysis target data and an icon representing a copied history;
FIG. 22 is a drawing showing an operation of synthesizing indicators of analysis display data in a history window;
FIG. 23 is a drawing showing a main window of a semiconductor test data analysis system according to the present invention;
FIG. 24 is a drawing showing the screen after analysis operation in detail from the main window of FIG. 23;
FIG. 25 is a drawing showing a screen for selecting the graphic format for displaying analysis data in a semiconductor test data analysis system according to the present invention;
FIG. 26 is a drawing showing a screen selected for copying an icon from Data_set2, Data_set3 and Frame1, which represent the analysis conditions and analysis procedure;
FIG. 27 is a drawing showing a screen when selected icons from Data_set2, Data_set3 and Frame1 are pasted into the window;
FIG. 28 is a drawing showing the screen when the Data_set2 icon and the Data_set1 icon shown in FIG. 27 are connected;
FIG. 29 is a drawing showing a screen for selecting an operation information to be loaded;
FIG. 30 is a drawing showing a screen for saving operation information;
FIG. 31 is a flowchart showing an analysis target data acquisition operation;
FIG. 32 is a flowchart showing a filtering operation;
FIG. 33 is a flowchart showing a sorting operation;
FIG. 34 is a flowchart showing a graphing operation;
FIG. 35 is a flowchart showing a copy-and-paste operation;
FIG. 36 is a flowchart showing an operation of loading operation information;
FIG. 37 is a flowchart showing an operation of saving operation information;
FIG. 38 is a flowchart showing a parameter changing operation; and
FIG. 39 is a flowchart showing an operation of overlapping graphs.

DETAILED DESCRIPTION OF THE PREFERRED EMBODIMENTS

Embodiments of the present invention are described in detail below, with reference made to relevant accompanying drawings.

An embodiment of a semiconductor test data analysis system according to the present invention is described below with reference to FIG. 1. This analysis system includes a computer 101, a display apparatus 102, and an input apparatus 103, such as a keyboard, a mouse, or a touch-panel. Although for the purpose of this description the computer 101, the display apparatus 102, and the input apparatus 103 are representing in the drawing as being separate, it will be understood that the computer 101, the display apparatus 102, and the input apparatus 103 can be integrated as one, such as is the case in a laptop computer or the like.

The display apparatus 102 is described here with reference to FIG. 1. Analysis target data stored in an analysis target data storage means 109 are displayed in a data window 104 of the display apparatus 102. Display data obtained by processing analysis target data is displayed in a display window 105 of the display apparatus 102. Additionally, commands stored in a historical data storage means 107 and executed in an analysis operation, and historical data indicating the sequence of the commands are displayed in a history window 108 of the display apparatus 102.

The analysis operation in a semiconductor test data analysis system according to the present invention is described in detail below.

FIG. 2 shows a history window for displaying an analysis operation history in a semiconductor test data analysis system according to the present invention. Icons 201 and 203 related to acquisition of analysis target data, icons 202 and 206 related to processing such as filtering and sorting, an icon 205 related to visual rendering of data, and indicators 204 and 207, which indicate analysis operation procedures, are displayed in the history window 108. Another example of a history window is shown in FIG. 28.

The system control program 106 of the computer 101 acquires analysis target data by an analysis operation. The acquisition of this analysis target data is done from at least one of the database 110, the data file 111, and the analysis target data storage means 109. The acquired analysis target data is stored in the analysis target data storage means 109. Furthermore, the above-noted operation information of the analysis operation is stored as the historical data in the historical data storage means 107. In response to storing the historical data, an icon in relation to the analysis operation is displayed in the history window 108. FIG. 3 and FIG. 4 show, respectively, windows used when a user searches the database 110 and when a user specifies the data file 111. In order to acquire data by searching the database, queries and filters may be used for Extraction Parameters, or the name of a prescribed file is input at the window shown in FIG. 3. If data is to be acquired from the data file, the name of a prescribed file is input at the window shown in FIG. 4. As a result, the analysis data is acquired from the database 110 or the data file 111 and the icon 201 is displayed in the history window 108.

The processing of data in the analysis system of the present invention includes at least one of data filtering and data sorting. The windows used by the user to specify data processing conditions for these analysis operations are shown in FIG. 5 and FIG. 6, respectively. In the window of FIG. 5, the user selects one or more data variables, and inputs item names and ranges thereof to execute filtering of analysis target data. In the window of FIG. 6, the user selects one or more data variables, and executes sorting of the prescribed analysis target data, in either ascending order or descending order. The operation information of the above-noted analysis operations can be stored in the historical data storage means 107 as historical data. The icon 202 associated with data processing is then added to the history window 108. The icon 202 is related to data processing that filters only data of the analysis target data specified by the icon 203 that satisfies prescribed conditions input from FIG. 5. For this reason, the icon 202 is displayed as an icon including characters indicating filtering. An indicator 204 is generated between the icon 202 and the icon 203, which is associated with analysis target data of the analysis operation. The indicator 204 is displayed as a straight line with an arrow related to the analysis operation procedure. By doing this, the user can tell at a glance what analysis operation was performed on which analysis target data. The analysis target data acquired by the processing of data is stored in the analysis target data storage means 109.

Visual rendering of data is described below, with reference to the icon 206. The icon 206, similar to the icon 202, is associated with filtering of only data of the analysis target data specified by a given an icon that satisfies prescribed conditions input from FIG. 5. When an analysis operation related to visual rendering of data is executed with respect to this icon 206, the computer 101 processes the analysis target data specified with the icon 206 by the system control program 106, generating display data for the visual rendering of data. The display data is then stored in the display data storage means 112, and the icon 205 is displayed in the display window 105. When this analysis operation related to visual rendering of data is specified, the computer 101 records the analysis information of the analysis operation at that time into the historical data storage means 107 as historical data, and the icon 205 associated with visual rendering of data is then displayed in the history window 108. Because the icon 205 is the analysis operation corresponding to the generation of a scatter plot as shown in FIG. 7, the icon is displayed so as to include a graphic indicating a scatter plot. An indicator 207 is generated between the icon 205 and the icon 206, which is associated with data processing to filter test data. The indicator 207 is displayed as a straight line with an arrow related to the analysis operation procedure. By doing this, the user can tell at a glance what analysis operation was performed on which analysis target data.

The visual rendering of data in the analysis system according to the present invention is not restricted to the scatter plot shown in FIG. 7, but also includes, for example, the cumulative distribution plot shown in FIG. 8, the histogram shown in FIG. 9, the wafer map shown in FIG. 10, the box and whiskers plot shown in FIG. 11, and the SPC (Statistical Process Control) plot shown in FIG. 12 or a table. The analysis system of the present invention further includes windows for the purpose of specifying conditions for analysis operations for these types of visual renderings, details of which are shown in FIG. 13 through FIG. 18. FIG. 13 is a setting window for the scatter plot shown in FIG. 7, from which the user can select the variables for the X and Y axes, display a logarithmic plot, select and display a plurality of analysis target data, and visually indicate display data. FIG. 14 is a setting window for the cumulative distribution plot shown in FIG. 8. FIG. 15 is a setting window for the histogram shown in FIG. 9. FIG. 16 is a setting window for the wafer map shown in FIG. 10. FIG. 17 is a setting window for the box and whiskers plot shown in FIG. 11. FIG. 18 is a setting window for the SPC plot shown in FIG. 12.

By specifying an arbitrary icon in the history window 108, the user can access at least one of any analysis target data or any display data stored in the analysis system of the present invention analysis target data, historical data, and display data obtained by data acquisition, data processing, and data visual rendering are stored, respectively, in the storage means 109, 107, and 112. The icons associated with data acquisition, data processing, and data visual rendering are each displayed in the history window 108.

In this case, these icons correspond to display means or input means for specifying some analysis operation. This is because the user can click or double click the left button of a mouse or the other selecting operations such like using a keyboard to select an icon from the history window 108, whereupon the computer 101, upon receiving the selection of that icon (for example, by a click or double click operation), by the system control program 106, displays the analysis target data associated with that icon in the data window 104 or the display data associated with that icon in the display window 105.

Additionally, the user can select an arbitrary icon in the history window 108, and re-execute with changed analysis conditions an analysis operation that had already been stored in the analysis system of the present invention. If the user selects an icon in the history window 108 with the right button of the mouse, it is possible to select setting windows (corresponding to the windows shown in FIG. 3, FIG. 4, FIG. 5, FIG. 6, FIG. 13, FIG. 14, FIG. 15, FIG. 16, FIG. 17, and FIG. 18) priorly associated with the icon. From any arbitrary use of these windows, if operation information or analysis information related to data acquisition, data processing, or visual rendering of data is changed, the computer 101, by the system control program 106, re-executes the analysis operation with the changed operation information or analysis information. The analysis target data updated by the re-execution of this analysis operation is then stored into the analysis target data storage means 109, the historical data at that time is stored into the historical data storage means 107, and the display data at that time is stored into the display data storage means 112.

In a case related to either of acquisition of data or data processing affected by a changed analysis operation, the computer 101, using the system control program 106, re-executes the analysis operation derived from the analysis target data related to the changed analysis operation with at least one of operation information or analysis information obtained from historical data. The analysis operation re-executed in this manner, as long as there exists an analysis operation derived from the changed analysis operation in the historical data, can be re-executed by the system control program 106 of the computer.

At the history window 108, the user can copy an icon derived from any arbitrary icon, and link to arbitrary analysis target data specified by this icon. By doing this, it is possible to apply an analysis operation already recorded in the analysis system of the present invention to an arbitrary analysis target data. For example, as shown in FIG. 19, at the history window 108 the user can hold down the left button of the mouse and drag the mouse so as to surround a plurality of icons (1901), which are specified as a set of icons. If the user requests copying, the system control program 106 of the computer 101 reads from the historical data storage means 107 the historical data related to each of the specified icons, and creates new historical data. At the history window 108 shown in FIG. 20, an icon associated with the newly copied historical data and an indicator are displayed together as 2001. In this display, there is distinction made between an icon and indicator related to analysis target data that have not yet been executed and an icon and indicator that have already been executed. An icon and indicator that have not yet been executed in this case are displayed translucently, so that the user can know their status at a glance.

As shown in FIG. 21, when an icon associated with analysis target data and an icon and indicator 2001 associated with a copied analysis operation are connected as shown by the indicator 2101, the computer, by the system control program 106, can apply the newly copied analysis operation to the analysis target data at the origin of the linked data. It is thus possible to integrate the analysis operations associated with a plurality of icons. This type of integration can be executed easily by the user by selecting an icon in the history window 108 on the display apparatus 102, and performing the same type of mouse operation as with a conventional computer. Additionally, the user can save the operation information of this selected analysis operation in the batch file 113 shown in FIG. 1. When this batch file 113 is selected, the computer 101, by the system control program 106, reads the selected batch file and generates historical data. When the historical data is generated in this manner, similar to the above-noted of copying, it is possible to apply the selected batch file to any arbitrary analysis target data.

In a case in which there is compatibility between at least one of the corresponding axes of both of two sets of display data, it is possible to combine one set of the display data to the other set of display data. This can be executed by a mouse operation made by the user at the history window 108. FIG. 22 shows two icons, 2201 and 2202 which exhibit compatibility in units between at least one of the corresponding axes (both being related to visual rendering of data, these being analysis operations that generate scatter plots). In this case if the user clicks and drags from the icon 2201 associated with analysis target data that is to be grouped up to the icon 2202 associated with another set to analysis target data, it is possible to request synthesis (grouping) of these analysis operations. When this synthesis is requested an indicator 2203 is generated from the icon 2201 to the icon 2202. The computer 101, by the system control program 106, then adds the analysis operation associated with the icon 2201 to the analysis operation associated with the icon 2202. When this is done, historical data of the analysis operation associated with the icon 2202 and historical data of the analysis operation associated with the icon 2201 are stored in the historical data storage means 107 of the computer 101. The display data associated with the icon 2202 is then changed, this display data being displayed in the display window 105. This causes the synthesized display of each of the display data associated with the icons 2201 and 2202 in the display window 105, in accordance with the display format and display items of the icons 2201 and 2202. It is possible, for example as shown in FIG. 7, to make different kinds of displays (for example, different colors or shapes) of icons associated with different analysis target data. By doing this, it is possible to make an overlapped display of display data associated with each of the analysis target data, thereby enabling the user to easily grasp the differences between each of the analysis target data.

Finally, in specific operations in the analysis system of the present invention are described below, with reference to the various screen shots from the display apparatus 102 shown in FIG. 23 though FIG. 30, and the flowcharts of FIG. 31 through FIG. 39.

(Analysis Target Data Acquisition)

At the main window shown in FIG. 23, the Extract Data button is selected to either search a database by means of the database search condition setting window shown in FIG. 3 or read a data file by means of the data file specification window shown in FIG. 4, thereby displaying an icon associated with the database or the data file, as shown by the reference numeral 201 in FIG. 2.

(Filtering)

At the history window shown in FIG. 2, any one of the icons associated with the analysis target data is selected. Then, the Filter button in the main window shown in FIG. 24 is selected, after which from the filter window of FIG. 5 the instruction for the analysis operation is given and the Filter button is selected, thereby displaying the original icon, an icon associated with filtering, and an indicator there between, as indicated by the reference numerals 202, 203, and 204 of FIG. 2.

(Sorting)

From the history window shown in FIG. 2, any one of the icons associated with the analysis target data is selected. Then, the Sort button shown in FIG. 24 is selected. From the sort window shown in FIG. 6, an instruction is given for sorting, and the Sort button is selected, thereby displaying an arrow and an icon as shown like 2404 in FIG. 24 and generating data.

(Graphing)

From the history window shown in FIG. 2, any one of the icons having the corresponding analysis data is selected. Next, the Create Frame button shown in FIG. 24 is selected so as to generate a display window showing a graph of the selected icon. Settings of the various tab pages of the window shown in FIG. 25 are made, and the Plot button is selected, thereby displaying the visual rendering of data, like showing in FIG. 7 through FIG. 12, an icon 2406 and an arrow. The contents of settings in tab pages hidden behind the Distribution tab page in FIG. 25 is similar to the various setting windows shown in FIGS. 13, 15, 16, 17, and 18.

(Copy & Paste)

As shown in FIG. 19 and FIG. 26, in the history window the mouse is used to select a range of icons to be joined. Next, in FIG. 27, Copy is selected from the Edit menu, and Paste is selected to issue an instruction for copying. By doing this, the copied icons and arrows are displayed in the history window. Suppose that in a case of which the most basic icon of the icons to be pasted is not connected to the icon indicated by the analysis target data as shown in FIG. 20. As indicated by the arrow from Data_set1 to Data_set5 in FIG. 21 the mouse is dragged after selecting the ->button 2410 shown in FIG. 24 so as to specify another icon (source, sort, filter) as the analysis target data of the most basic icon of the pasted icons, thereby connecting the two icons with an indicator 2101.

(Loading Operation Information)

The Load Method button shown in FIG. 24 is selected. Next, from the Load Method Window shown in FIG. 29 the load method to be used is selected. By doing this, the two icons 2001 and arrows shown in FIG. 20 are displayed.

(Saving Operation Information)

As shown in FIG. 19, from the history window when an icon (or plurality of selected icons) is selected (1901), the display for the selected region changes. Next, Save Method is selected from the File menu in the tool bar in FIG. 24. Save Method window in FIG. 30 is displayed. The file name is then specified, and the Save button is selected in the window.

(Changing Parameters)

From the history window, an icon is clicked with the right mouse button, thereby causing display either of setting windows shown in FIG. 3 through FIG. 6 or FIG. 13 through FIG. 18, from which the re-setting of analysis conditions and analysis procedures is performed. By doing this, for example, if the filter conditions of Data_set4 2402 in FIG. 24 is changed, the analysis target data specified by Data_set4 is updated and, therefore, the process for the analysis target data (2404 and 2406) is re-executed. Accordingly, the re-set of analysis conditions and analysis procedures are reflected to the results.

(Overlapping Display Data)

The Overplot button 2408 shown in FIG. 24 is selected and a mouse is dragged with holding the left mouse button from a source icon of join to a destination icon of join so as to establish a relationship between two operation information. By doing this, display data of the source icon is overlapped and displayed jointly onto the graph associated with the icon at the front end of the arrow, i.e., the destination icon.

As described in detail above, because the analysis system of the present invention automatically records previously executed analysis operations, a user can easily access these analysis operations for each analysis operation. For this reason, particularly in the case of the early stages of the semiconductor manufacturing development process, it is possible to perform quick trial-and-error analysis to determine the optimum analysis conditions and analysis operations. Even at a late stage in the semiconductor manufacturing process, when the user performs batch processing based on already optimized analysis operations, it is possible to perform the batch processing quickly and easily. Because analysis information is visually rendered, the user can easily understand operation information or analysis information, thereby preventing operational errors. Because a user can quickly analysis diverse analysis target data, it is possible more quickly identify failure locations. For this reason, the present invention can improve production efficiency and reduce cost.

What is claimed is:

1. A method for displaying in a semiconductor test data analysis system which automatically records operation information of an analysis operation, including analysis conditions or an analysis procedure for input test data, and analysis information obtained by the analysis operation, which includes a processing means and a display means, the method comprising the steps of:

displaying first analysis target data of a first analysis operation as a first icon;

displaying first operation information of the first analysis operation as a second icon;

displaying a first indicator representing a relationship between the first icon and the second icon as a first arrow, wherein the first operation information is related to processing of the first analysis operation;

displaying a second operation information of the first analysis operation as a third icon; and displaying a second indicator representing a relationship between the second icon and the third icon as a second arrow, wherein the second operation information is related to visual rendering of data of the first analysis operation, wherein when an analysis condition for any of the icons is changed, the first analysis operation is automatically re-executed.

2. A method for displaying in a semiconductor test data analysis system which automatically records operation information of an analysis operation, including analysis conditions or an analysis procedure for input test data, and analysis information obtained by the analysis operation, which includes a processing means and a display means, the method comprising the steps of:

displaying first analysis target data of a first analysis operation as a first icon;

displaying first operation information of the first analysis operation as a second icon;

displaying a first indicator representing a relationship between the first icon and the second icon as a first arrow, wherein the first operation information is related to processing of the first analysis operation;

displaying a second operation information of the first analysis operation as a third icon;

displaying a second indicator representing a relationship between the second icon and the third icon as a second arrow, wherein the second operation information is related to visual rendering of data of the first analysis operation, copying the second and the third icons and the second arrow of the first analysis operation as a fourth icon and a fifth icon and a third arrow displayed translucently;

displaying a second analysis target data as a sixth icon; and displaying a third indicator representing a relationship between the sixth icon and the fourth icon as a fourth arrow so as to display a second analysis operation consisting of the fourth, fifth and sixth icons and the third and fourth arrows.

3. A method for displaying in a semiconductor test data analysis system which automatically records operation information of an analysis operation, including analysis conditions or an analysis procedure for input test data, and analysis information obtained by the analysis operation, which includes a processing means and a display means, the method comprising the steps of:

displaying first analysis target data of a first analysis operation as a first icon;

displaying first operation information of the first analysis operation as a second icon;

displaying a first indicator representing a relationship between the first icon and the second icon as a first arrow, wherein the first operation information is related to processing of the first analysis operation;

displaying a second operation information of the first analysis operation as a third icon;

displaying a second indicator representing a relationship between the second icon and the third icon as a second arrow, wherein the second operation information is related to visual rendering of data of the first analysis operation, displaying seventh, eighth and ninth icons, a fifth arrow connected from the seventh icon to the eighth icon, and a sixth arrow connected from the eighth icon to the ninth icon of a third analysis operation; and displaying a seventh arrow connected from the third icon to the ninth icon which exhibits compatibility on visual rendering in units between at least one of corresponding axes of the display apparatus.

* * * * *